(12) United States Patent
Kim et al.

(10) Patent No.: US 11,726,404 B2
(45) Date of Patent: Aug. 15, 2023

(54) SPONTANEOUS-EMISSION TYPE PHOTOSENSITIVE RESIN COMPOSITION, COLOR FILTER MANUFACTURED USING SAME, AND IMAGE DISPLAY APPARATUS

(71) Applicant: DONGWOO FINE-CHEM CO., LTD., Iksan-si (KR)

(72) Inventors: Hyung Joo Kim, Pyeongtaek-si (KR); Doc Ki Kang, Pyeongtaek-si (KR); Jeong Sik Kim, Anseong-si (KR); Ju Ho Kim, Pyeongtaek-si (KR); Sung Hun Hong, Pyeongtaek-si (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 883 days.

(21) Appl. No.: 16/345,438

(22) PCT Filed: Sep. 6, 2017

(86) PCT No.: PCT/KR2017/009749
§ 371 (c)(1),
(2) Date: Apr. 26, 2019

(87) PCT Pub. No.: WO2018/080008
PCT Pub. Date: May 3, 2018

(65) Prior Publication Data
US 2019/0278173 A1    Sep. 12, 2019

(30) Foreign Application Priority Data

Oct. 26, 2016  (KR) .................. 10-2016-0140072
Mar. 30, 2017  (KR) .................. 10-2017-0040616
Aug. 24, 2017  (KR) .................. 10-2017-0107198

(51) Int. Cl.
| | | |
|---|---|---|
| C08G 63/676 | (2006.01) | |
| G02B 5/20 | (2006.01) | |
| G03F 7/00 | (2006.01) | |
| G03F 7/004 | (2006.01) | |
| G03F 7/038 | (2006.01) | |
| G03F 7/039 | (2006.01) | |
| G03F 7/032 | (2006.01) | |
| G02B 5/22 | (2006.01) | |
| G03F 7/028 | (2006.01) | |
| G03F 7/027 | (2006.01) | |
| G02F 1/1335 | (2006.01) | |

(52) U.S. Cl.
CPC .......... *G03F 7/0007* (2013.01); *C08G 63/676* (2013.01); *G02B 5/206* (2013.01); *G02B 5/22* (2013.01); *G02F 1/1335* (2013.01); *G03F 7/00* (2013.01); *G03F 7/004* (2013.01); *G03F 7/0042* (2013.01); *G03F 7/0043* (2013.01); *G03F 7/027* (2013.01); *G03F 7/028* (2013.01); *G03F 7/032* (2013.01); *G03F 7/038* (2013.01); *G03F 7/039* (2013.01)

(58) Field of Classification Search
CPC ..... G03F 7/0007; G03F 7/038; C08G 63/676; G02B 5/206
See application file for complete search history.

(56) References Cited

U.S. PATENT DOCUMENTS

| | | | | |
|---|---|---|---|---|
| 4,495,276 A | * | 1/1985 | Takimoto ............... | G03C 1/853 |
| | | | | 430/530 |
| 2012/0161088 A1 | * | 6/2012 | Choi ....................... | G03F 7/032 |
| | | | | 430/286.1 |
| 2016/0011506 A1 | * | 1/2016 | Gu .......................... | G03F 7/029 |
| | | | | 430/281.1 |

FOREIGN PATENT DOCUMENTS

| | | | | |
|---|---|---|---|---|
| CN | 105652595 A | | 6/2016 | |
| JP | 2015-111264 | | 6/2015 | |
| JP | 2015-155538 | | 8/2015 | |
| JP | 2016-098375 | | 5/2016 | |
| KR | 10-2012-0002372 | | 1/2012 | |
| KR | 10-2013-0000506 A | | 1/2013 | |
| KR | 10-2015-0046933 | | 5/2015 | |
| KR | 20150055417 A | * | 5/2015 | |
| KR | 10-2016-0001450 | | 1/2016 | |
| KR | 10-2016-0025735 | | 3/2016 | |
| KR | 10-2016-0114292 | | 10/2016 | |
| WO | WO-2017057813 A1 | * | 4/2017 | ........... C08G 63/137 |

OTHER PUBLICATIONS

English machine translation of KR-20150055417A (May 2015) (Year: 2015).*
English machine translation of WO-2017057813A1 (Apr. 2017) (Year: 2017).*
Notice of Reasons for Refiisal issued in corresponding Japanese Patent Appln. No. 2019-521773 dated Dec. 22, 2020, and its English translation.
The First Office Action dated Nov. 29, 2021, of counterpart Chinese Patent Application No. 201780064790.1, along with an English translation.

* cited by examiner

*Primary Examiner* — Peter L Vajda
*Assistant Examiner* — Jayson D Cosgrove
(74) *Attorney, Agent, or Firm* — DLA Piper LLP (US)

(57) ABSTRACT

According to the present invention, a spontaneous-emission type photosensitive resin composition comprises a cardo-based binder resin comprising at least one repeating unit of chemical formula 1 to chemical formula 4.

8 Claims, No Drawings

SPONTANEOUS-EMISSION TYPE PHOTOSENSITIVE RESIN COMPOSITION, COLOR FILTER MANUFACTURED USING SAME, AND IMAGE DISPLAY APPARATUS

TECHNICAL FIELD

The present invention relates to a self-emissive photosensitive resin composition including a specific cardo-based binder resin, and a color filter and an image display device prepared using the same.

BACKGROUND ART

A color filter is an optical component in the form of a thin film that realizes color by extracting three colors of red, green, and blue in pixel units from white light. The size of one pixel is several tens to several hundred micrometers. In such color filter, a black matrix layer is formed in a predetermined pattern on a transparent substrate for shielding a boundary portion between each pixel, and pixel portions, in which three primary colors of a plurality of colors (typically, red (R), green (G), and blue (B)) are arranged in a predetermined pattern to form each pixel, are stacked in order.

Recently, as a method of implementing a color filter, a pigment dispersion method using a pigment dispersion type photosensitive resin has been applied. However, when light emitted from a light source passes through a color filter, a portion of the light is absorbed by the color filter, thus lowering luminous efficacy, and color reproduction is deteriorated due to the characteristics of pigments contained in the color filter.

In particular, since a color filter is used in various fields including various image display devices, performance such as high color reproducibility, superior brightness, and high contrast ratio is required in addition to excellent pattern characteristics. Accordingly, to solve such problems, a method of preparing a color filter using a self-emissive photosensitive resin composition containing quantum dots has been proposed.

Such photosensitive resin composition containing quantum dots is becoming increasingly important as the use of image display devices such as LCDs are becoming more advanced and diversified. Accordingly, there is increasing demand for productivity, chemical resistance, and durability in addition to excellent color reproduction characteristics.

Korean Patent Application Publication No. 2013-0000506 relates to a display device, including a light source; and a display panel on which light emitted from the light source is incident, wherein the display panel includes a plurality of color conversion units, wherein the color conversion units include a plurality of wavelength conversion particles for converting a wavelength of the light; and a plurality of color filter particles which absorb light of a predetermined wavelength band.

However, when the display device described above is used, it is difficult to achieve high resolution due to poor color reproduction characteristics. In addition, the display device has poor surface hardness and chemical resistance, and has a low light retention rate. Therefore, there is a demand for a self-emissive photosensitive resin composition, which is excellent in performance such as surface hardness and chemical resistance and may realize superior image quality.

[Patent Document 1 for reference Korean Patent Application Publication No. 2013-0000506 (Jan. 3, 2013)]

DISCLOSURE OF INVENTION

Technical Problem

Therefore, the present invention has been made in view of the above problems, and it is an objective of the present invention to provide a self-emissive photosensitive resin composition having excellent color reproducibility and a high light retention rate.

It is another objective of the present invention to provide a color filter and an image display device, which are prepared using the self-emissive photosensitive resin composition and have excellent surface hardness and excellent chemical resistance.

Solution to Problem

In accordance with the present invention, the above and other objectives can be accomplished by the provision of a self-emissive photosensitive resin composition, including a cardo-based binder resin, wherein the cardo-based binder resin includes at least one of the repeating units represented by Formulas 1 to 4 below.

Formula 1

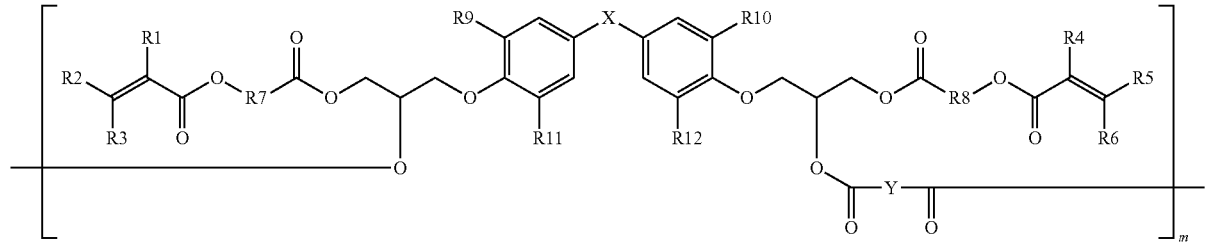

Formula 2

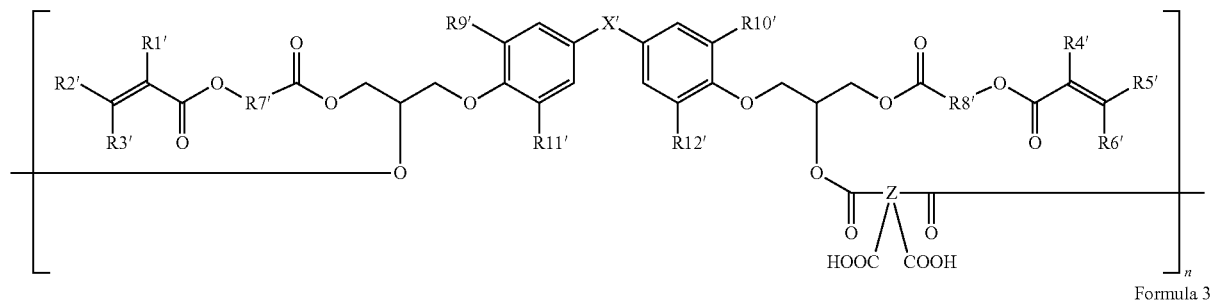

Formula 3

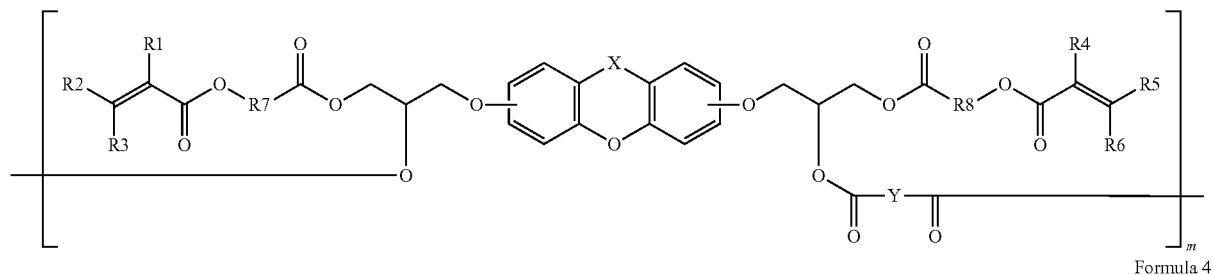

Formula 4

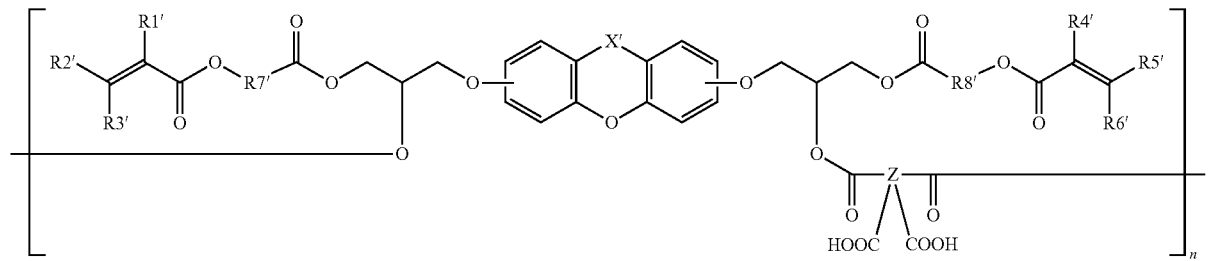

in Formulas 1 to 4,

X and X' each independently represent a single bond, —CO—, —SO$_2$—, —C(CF$_3$)$_2$—, —Si(CH$_3$)$_2$—, —CH$_2$—, —C(CH$_3$)$_2$—, —O—,

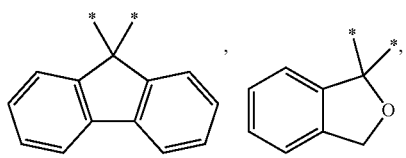

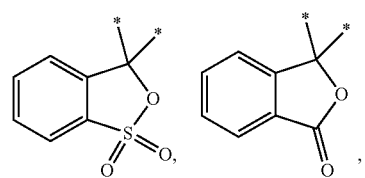

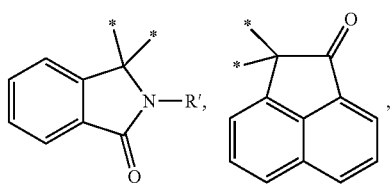

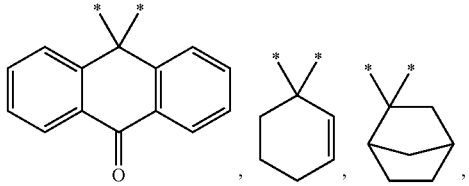

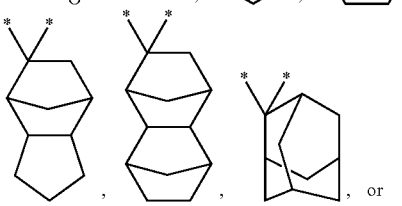

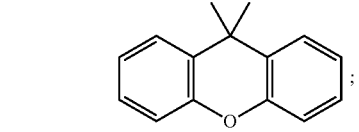

1. Y represents an acid anhydride residue;
2. Z represents an acid dianhydride residue;
3. R' represents a hydrogen atom, an ethyl group, a phenyl group, —C$_2$H$_4$Cl, —C$_2$H$_4$OH or —CH$_2$CH=CH$_2$;
4. R1, R1', R2, R2', R3, R3', R4, R4', R5, R5', R6 and R6' each independently represent a hydrogen atom or a methyl group;

5. R7, R7', R8 and R8' each independently represent a straight- or branched-chain alkylene group having 1 to 6 carbon atoms, wherein the alkylene group may be interrupted by at least one of an ester bond, a cycloalkylene group having 6 to 14 carbon atoms, and an arylene group having 6 to 14 carbon atoms;

6. R9, R9', R10, R10', R11, R11', R12 and R12' each independently represent a hydrogen atom, a halogen atom or a straight- or branched-chain alkyl group having 1 to 5 carbon atoms; and 7. m and n are integers satisfying $0 \leq m \leq 30$ and $0 \leq n \leq 30$, respectively, 8. provided that m and n are not 0 at the same time.

9. In accordance with an aspect of the present invention, the above and other objectives can be accomplished by the provision of a color filter including the cured product of the self-emissive photosensitive resin composition.

10. In accordance with another aspect of the present invention, there is provided an image display device including the color filter.

Advantageous Effects of Invention

The self-emissive photosensitive resin composition according to the present invention has excellent surface hardness, and can be used to prepare a color filter having excellent chemical resistance.

In addition, a color filter and an image display device, which are prepared using the self-emissive photosensitive resin composition according to the present invention, has excellent surface hardness, chemical resistance, and color reproducibility and has a high light retention rate.

MODE FOR THE INVENTION

Hereinafter, the present invention will be described in more detail.

In the present invention, when a member is located "on" the other member, this includes not only the case where the member is in contact with the other member but also the case where another member is present between the two members.

In the present invention, it is to be understood that, unless otherwise stated, when a part "comprises" any element, the part may include other elements without excluding other elements.

Self-Emissive Photosensitive Resin Composition

The self-emissive photosensitive resin composition according to the present invention includes an alkali-soluble resin including a specific cardo-based binder resin.

Alkali-Soluble Resin

The alkali-soluble resin according to the present invention includes a cardo-based binder resin including at least one of the repeating units represented by Formulas 1 to 4 below.

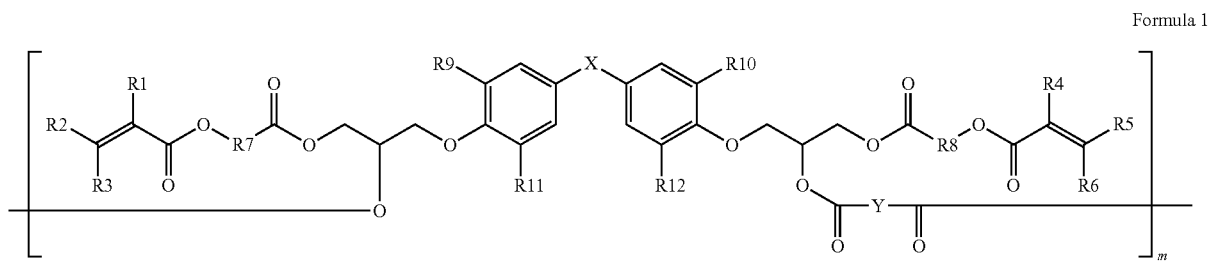

Formula 1

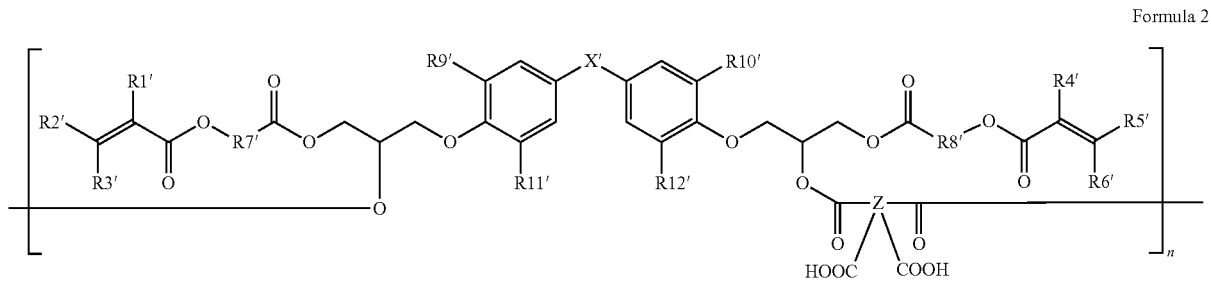

Formula 2

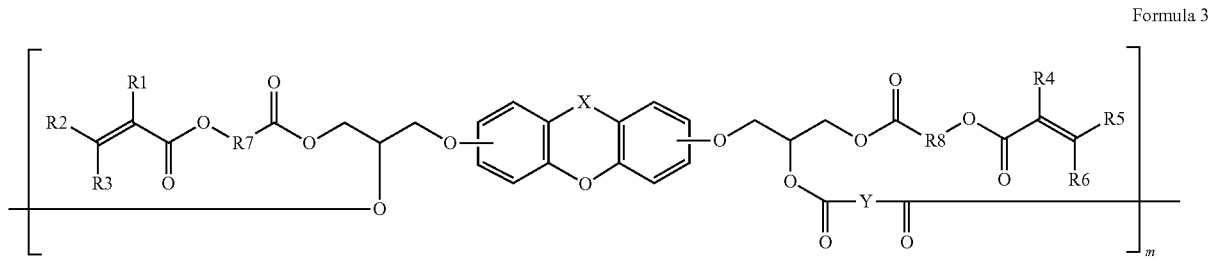

Formula 3

-continued

Formula 4

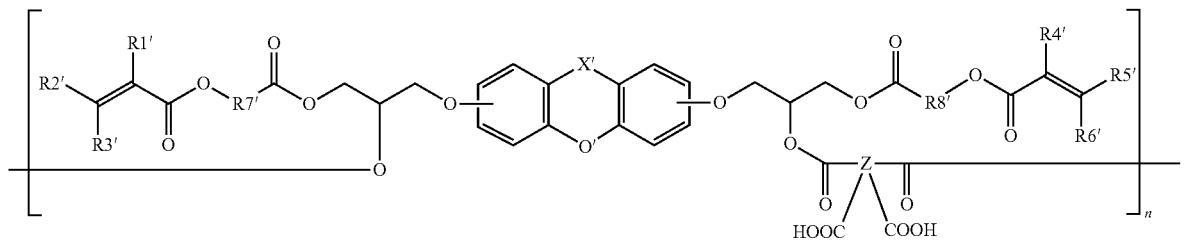

in Formulas 1 to 4,

X and X' each independently represent a single bond, —CO—, —SO$_2$—, —C(CF$_3$)$_2$—, —Si(CH$_3$)$_2$—, —CH$_2$—, —C(CH$_3$)$_2$—, —O—,

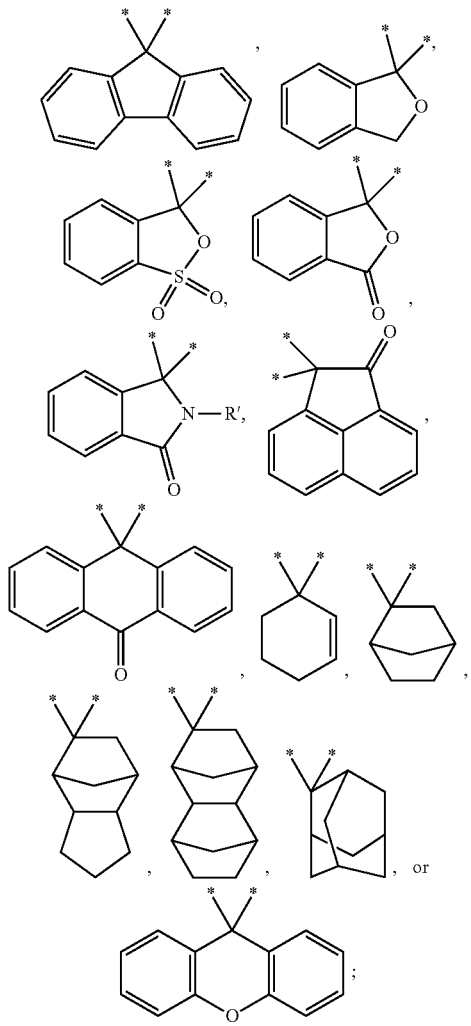

Y represents an acid anhydride residue;
Z represents an acid dianhydride residue;
R' represents a hydrogen atom, an ethyl group, a phenyl group, —C$_2$H$_4$Cl, —C$_2$H$_4$OH or —CH$_2$CH═CH$_2$;
R1, R1', R2, R2', R3, R3', R4, R4', R5, R5', R6 and R6' each independently represent a hydrogen atom or a methyl group;

R7, R7', R8 and R8' each independently represent a straight- or branched-chain alkylene group having 1 to 6 carbon atoms, wherein the alkylene group may be interrupted by at least one of an ester bond, a cycloalkylene group having 6 to 14 carbon atoms, and an arylene group having 6 to 14 carbon atoms;

R9, R9', R10, R10', R11, R11', R12 and R12' each independently represent a hydrogen atom, a halogen atom or a straight- or branched-chain alkyl group having 1 to 5 carbon atoms; and m and n are integers satisfying 0≤m≤30 and 0≤n≤30, respectively, provided that m and n are not 0 at the same time.

Preferably, R7, R7', R8 and R8' each independently represent a straight- or branched-chain alkylene group having 1 to 6 carbon atoms, wherein the alkylene group may be interrupted by at least one of an ester bond, a cycloalkylene group having 6 to 14 carbon atoms, and an arylene group having 6 to 14 carbon atoms. Preferably, the alkylene group is an ethylene group,

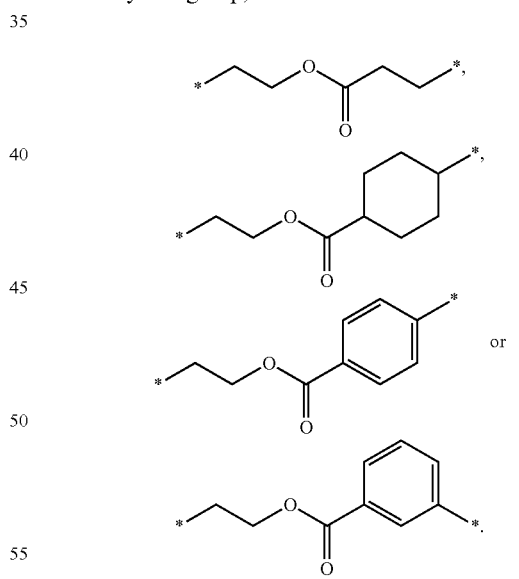

When the self-emissive photosensitive resin composition according to the present invention includes a cardo-based binder resin including at least one of the repeating units represented by Formulas 1 to 4, reliability between processes may be improved.

When the cardo-based binder resin according to the present invention includes two or more or all of the repeating units represented by Formulas 1 to 4, a molar ratio is not particularly limited. For example, when the cardo-based binder resin includes two or more repeating units, the molar ratio of the repeating units is 1/99 to 90/10, more preferably 5/95 to 80/20. Preferably, the molar ratio of the repeating units is m/n.

When the molar ratio of the repeating units, specifically m/n, satisfies the above range, the content of the carboxyl group of the binder resin is appropriately maintained. As a result, the alkali resistance of the binder resin is improved. In addition, a developing solution does not flow out from an exposed portion, and alkali developing properties are improved, so that a fine pattern may be formed.

Y in Formulas 1 and 3 represents a residue of an acid anhydride, and may be obtained by reacting a bisphenol epoxy acrylate compound, which is a synthetic intermediate of the cardo-based binder resin of the present invention, with an acid anhydride compound. An acid anhydride compound to which residue Y may be introduced is not particularly limited, and includes, for example, maleic anhydride, succinic anhydride, itaconic anhydride, phthalic anhydride, tetrahydrophthalic anhydride, hexahydrophthalic anhydride, methyl endo-methylene-tetrahydrophthalic anhydride, chlorendic anhydride, methyltetrahydrophthalic anhydride, and the like.

Z in Formulas 2 and 4 represents a residue of an acid dianhydride, and may be obtained by reacting a bisphenol epoxy acrylate compound, which is a synthetic intermediate of the cardo-based binder resin of the present invention, with an acid dianhydride compound. An acid dianhydride compound to which residue Z may be introduced is not particularly limited, and includes, for example, aromatic polycarboxylic anhydrides, such as pyromellitic anhydride, benzophenonetetracarboxylic dianhydride, biphenyltetracarboxylic dianhydride, and biphenylethertetracarboxylic dianhydride.

In the present invention, 'single bond' means structures directly connected to each other without other functional groups. For example, in Formula 1, oxyphenyl groups are directly connected without X and X'.

Further, in the present invention, 'acid dianhydride' refers to a compound containing two acid anhydride groups.

In the present invention, there is no particular limitation on the method of polymerizing the cardo-based binder resin containing any one of the repeating units represented by Formulas 1 to 4.

For example, a bisphenol epoxy compound is synthesized by reacting a bisphenol compound with an epoxy compound, the synthesized bisphenol epoxy compound is reacted with an acrylate compound to synthesize a bisphenol epoxy acrylate compound, and the bisphenol epoxy acrylate compound is reacted with an acid anhydride, an acid dianhydride or mixtures thereof to prepare the cardo-based binder resin. For example, at least one compound selected from the group consisting of maleic anhydride, succinic anhydride, itaconic anhydride, phthalic anhydride, tetrahydrophthalic anhydride, hexahydrophthalic anhydride, methyl endo-methylene-tetrahydrophthalic anhydride, chlorendic anhydride, and methyltetrahydrophthalic anhydride or at least one acid dianhydride selected from the group consisting of aromatic polycarboxylic anhydrides such as pyromellitic anhydride, benzophenonetetracarboxylic dianhydride, biphenyltetracarboxylic dianhydride, and biphenylethertetracarboxylic dianhydride may be used, without being limited thereto.

Preferably, the cardo-based binder resin according to the present invention may be prepared by polymerizing a compound represented by Formula 7 or a compound represented by Formula 8.

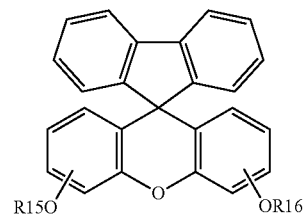

Formula 7

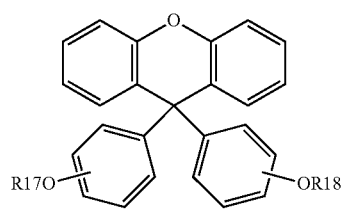

Formula 8 in Formulas 7 and 8,
R15 to R18 each independently represent

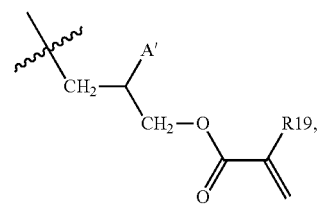

1. wherein A' represents hydrogen, an alkyl group having 1 to 5 carbon atoms or a hydroxyl group, and
2. R19 represents hydrogen or an alkyl group having 1 to 5 carbon atoms.

When the alkali-soluble resin according to the present invention includes a cardo-based binder resin prepared by polymerizing a compound represented by Formula 7, adhesion to a substrate is improved and development of adhesion is improved, so that a fine, high resolution pattern may be realized.

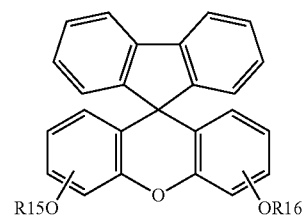

Formula 7

In Formula 7, R15 and R16 each independently represent

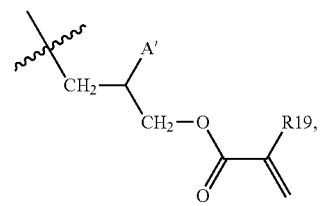

wherein A' represents a hydrogen atom, an alkyl group having 1 to 5 carbon atoms or a hydroxyl group, R19 represents a hydrogen atom or an alkyl group having 1 to 5 carbon atoms. Preferably, A' represents a hydroxyl group, and R19 represents a hydrogen atom or a methyl group.

The compound represented by Formula 7 may be synthesized using a compound represented by Formula 9 below, and a cardo-based binder resin having alkali solubility may be obtained by further reacting the synthesized compound with an acid anhydride compound or an acid dianhydride compound.

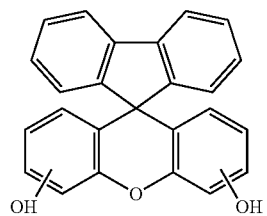

Formula 9

For example, the compound represented by Formula 9 is mixed with epichlorohydrin and t-butylammonium bromide, the mixture is reacted by heating in a solvent, and an aqueous alkali solution is added thereto. Then, precipitation and separation are performed to synthesize an epoxy compound, and reaction is performed by mixing the synthesized epoxy compound with t-butylammonium bromide, acrylic acid, a phenolic compound, and a solvent to obtain a compound. The obtained compound may be reacted with at least one acid anhydride compound selected from the group consisting of maleic anhydride, succinic anhydride, itaconic anhydride, phthalic anhydride, tetrahydrophthalic anhydride, hexahydrophthalic anhydride, methyl endo-methylene-tetrahydrophthalic anhydride, chlorendic anhydride, and methyltetrahydrophthalic anhydride or at least one acid dianhydride selected from the group consisting of aromatic polycarboxylic anhydrides such as pyromellitic anhydride, benzophenonetetracarboxylic dianhydride, biphenyltetracarboxylic dianhydride, and biphenylethertetracarboxylic dianhydride, without being limited thereto.

In addition, when the alkali-soluble binder resin according to the present invention includes a cardo-based binder resin prepared by polymerizing a compound represented by Formula 8 below, adhesion to a substrate is improved and development of adhesion is improved, so that a fine, high resolution pattern may be realized.

Formula 8

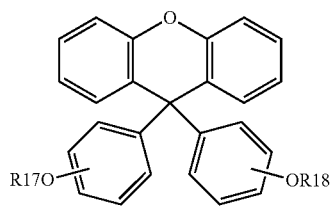

In Formula 8, R17 and R18 each independently represent

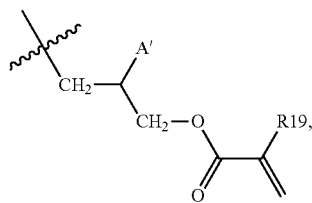

wherein A' represents a hydrogen atom, an alkyl group having 1 to 5 carbon atoms or a hydroxyl group, and R19 represents a hydrogen atom or an alkyl group having 1 to 5 carbon atoms. Preferably, A' represents a hydroxyl group, and R19 represents a hydrogen atom or a methyl group.

The compound represented by Formula 8 may be synthesized using a compound represented by Formula 10 below, and a cardo-based binder resin having alkali solubility may be obtained by further reacting the synthesized compound with an acid anhydride compound or an acid dianhydride compound.

Formula 10

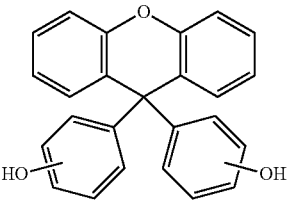

For example, the compound represented by Formula 10 is mixed with epichlorohydrin, t-butylammonium bromide, and a solvent, the mixture is reacted by heating, and an aqueous alkali solution is added thereto. Then, precipitation and separation are performed to synthesize an epoxy compound, and reaction is performed by mixing the synthesized epoxy compound with t-butylammonium bromide, acrylic acid, a phenolic compound and a solvent to obtain a compound. The obtained compound may be reacted with at least one acid anhydride compound selected from the group consisting of maleic anhydride, succinic anhydride, itaconic anhydride, phthalic anhydride, tetrahydrophthalic anhydride, hexahydrophthalic anhydride, methyl endo-methylene-tetrahydrophthalic anhydride, chlorendic anhydride, and methyltetrahydrophthalic anhydride or at least one acid dianhydride selected from the group consisting of aromatic polycarboxylic anhydrides such as pyromellitic anhydride, benzophenonetetracarboxylic dianhydride, biphenyltetracarboxylic dianhydride, and biphenylethertetracarboxylic dianhydride, without being limited thereto.

In Formulas 9 and 10, the position of a hydroxyl group (—OH) is not particularly limited and may be, for example, the 2-position, 3-position, or 4-position. Preferably, the position of a hydroxyl group is the 4-position (Carbon bonded to xanthene is determined as the 1-position, and the position of the hydroxyl group is determined based thereon).

As a result, depending on the position of the hydroxyl group (—OH) of Formula 9 or 10, the substitution position of R15 to R18 of Formulas 7 and 8 may be determined.

For example, the compound represented by Formula 7 or 8 may include at least one selected from the group consisting of 9,9-bis(3-cinnamic diester)fluorene, 9,9-bis(3-cinnamoyl, 4-hydroxyphenyl)fluorene, 9,9-bis(glycidyl methacrylate ether)fluorene, 9,9-bis(3,4-dihydroxyphenyl)fluorene dicinnamic ester, 3,6-diglycidyl methacrylate ether spiro(fluorene-9,9-xanthene), 9,9-bis(3-allyl,4-hydroxyphenylfluorene), 9,9-bis(4-allyloxyphenyl)fluorene, and 9,9-bis(3,4-methacrylic diester)fluorene, without being limited thereto.

The acid value of the cardo-based binder resin may be 10 to 200 mgKOH/g, preferably 30 to 150 mgKOH/g. When the acid value is within the above range, a sufficient developing speed may be ensured, and a fine, high resolution pattern may be realized.

The weight-average molecular weight of the cardo-based binder resin may be 2,000 to 100,000, preferably 3,000 to 40,000. When the weight-average molecular weight is 2,000 to 100,000, adhesion and developability may be improved.

In one embodiment of the present invention, the cardo-based binder resin may be contained in an amount of 1 to 50 parts by weight, preferably 6 to 40 parts by weight, more preferably 9 to 35 parts by weight, with respect to 100 parts by weight of the total self-emissive photosensitive resin composition.

When the content of the cardo-based binder resin is within the above range, solubility in a developing solution is sufficient, and pattern formation is easy. When the content of the cardo-based binder resin is less than the above range, a non-pixel portion may be omitted. When the content of the cardo-based binder resin exceeds the above range, solubility in a developing solution may be somewhat lowered, and pattern formation may be somewhat difficult.

In yet another embodiment of the present invention, the alkali-soluble resin may further include a cardo-based binder resin including at least one of the repeating units represented by Formulas 5 and 6 below.

Formula 5

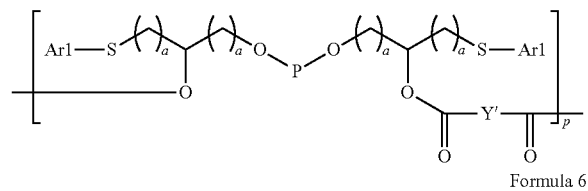

Formula 6

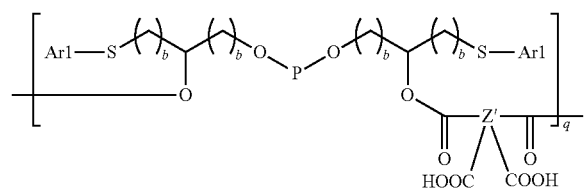

in Formulas 5 and 6,

P represents

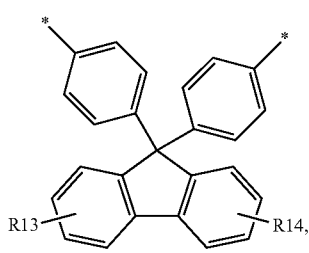

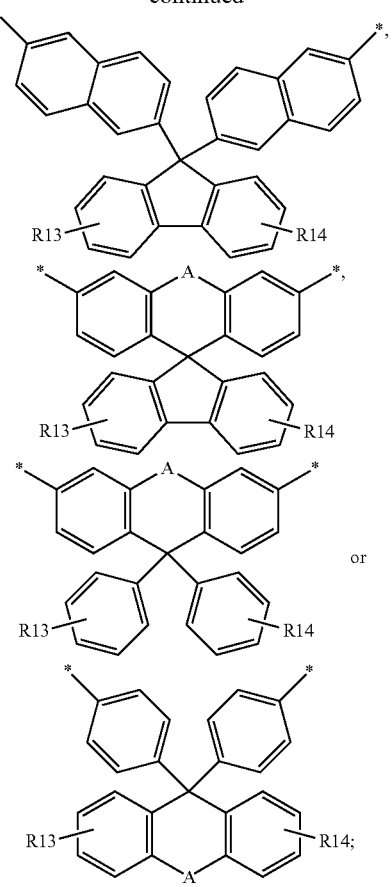

R13 and R14 each independently represent hydrogen, a hydroxyl group, a thiol group, an amino group, a nitro group or a halogen atom;

Ar1 each independently represents a $C_6$ to $C_{15}$ aryl group;

Y' represents an acid anhydride residue;

Z' represents an acid dianhydride residue;

A represents O, S, N, Si or Se;

a and b are each independently an integer of 1 to 6;

p and q are each independently an integer of 0 to 30, provided that p and q are not 0 at the same time; and the halogen atom is F, Cl, Br or I.

The aryl group may be a C6 to C15 monocyclic aryl group, or a polycyclic aryl group. The monocyclic aryl group may include a phenyl group, a biphenyl group, a terphenyl group, a stylbenyl group, and the like, without being limited thereto. The polycyclic aryl group may include a naphthyl group, an anthracenyl group, a phenanthryl group, a pyrenyl group, a perylenyl group, a crycenyl group, a fluorenyl group, and the like, without being limited thereto.

In Formula 5, Y' represents a residue of an acid anhydride. The content of Y described above may be applied to describe the acid anhydride to which residue Y' may be introduced.

In Formula 6, Z' represents a residue of an acid dianhydride. An acid dianhydride compound to which residue Z' may be introduced is not particularly limited, and the content of Z described above may be applied to the acid dianhydride compound.

When the cardo-based binder resin according to the present invention is included in the self-emissive photosensitive resin composition, unnecessary photopolymerization due to light reflection during an exposure process may be suppressed by further introducing a non-reactive alkali-soluble resin containing no unsaturated double bond. In addition, acid value adjustment according to the content of the resin increases solubility in a developing solution. As a result, there are advantages that pattern formation is easy and the occurrence of residue generation may be suppressed.

When the alkali-soluble resin further includes a cardo-based binder resin including at least one of the repeating units represented by Formulas 5 and 6, the cardo-based binder resin may be contained in an amount of 1 to 100 parts by weight, preferably 10 to 90 parts by weight, more preferably 20 to 80 parts by weight, with respect to 100 parts by weight of the total alkali-soluble resin.

When the cardo-based binder resin is further included within the above range, the occurrence of residue generation during a developing process is suppressed and a pattern-forming property is improved.

For example, a cardo-based binder resin including a least one of the repeating units represented by Formulas 5 and 6 may be prepared in the following manner.

Any one of compounds represented by Formulas 11 to 15 is reacted with an epoxy compound such as epichlorohydrin under the presence of a base catalyst or acid catalyst, and then is reacted with a compound such as thiophenol, 1-thionaphthalene, and 2-thionaphthalene to synthesize compounds represented by Formulas 16 to 20 below.

Thereafter, a cardo-based binder resin including at least one of the repeating units represented by Formulas 5 and 6 may be obtained by polymerizing a compound represented by Formulas 16 to 20 below with a carboxylic dianhydride.

Formula 11
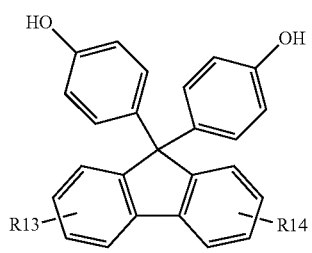

Formula 12
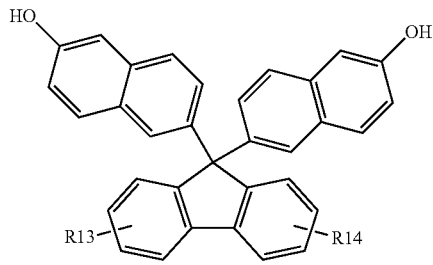

Formula 13
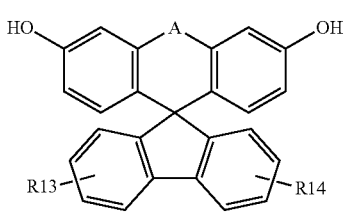

Formula 14
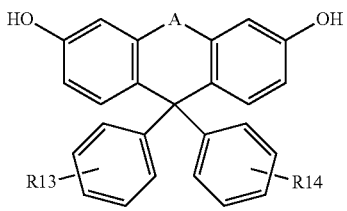

Formula 15
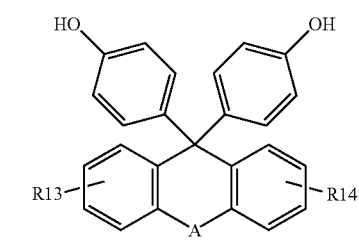

In Formula 11 to 15, A, R13, and R14 are as defined in Formulas 5 and 6.

Formula 16
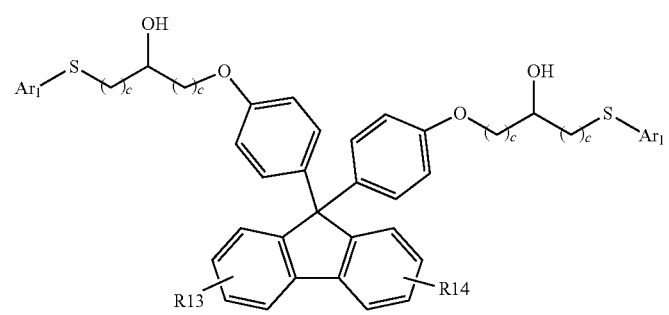

Formula 17

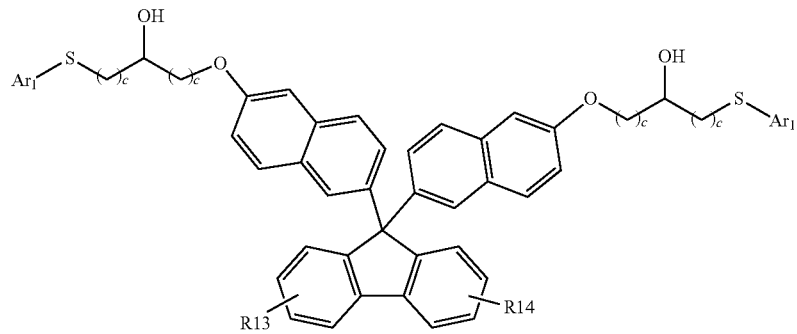

Formula 18

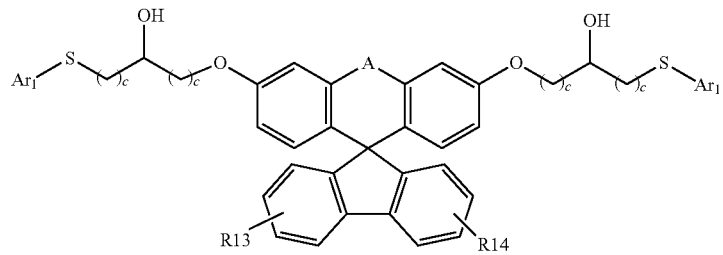

Formula 19

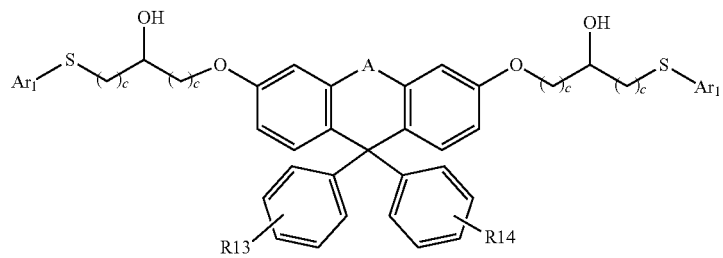

Formula 20

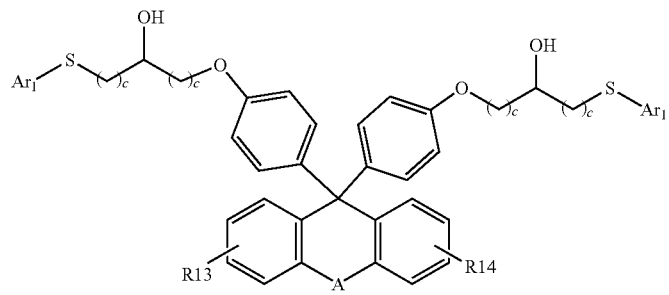

In Formulas 16 to 20, c is an integer of 1 to 6, and A, Ar1, R13, and R14 are as defined in Formulas 5 and 6.

For example, the carboxylic dianhydride may include an aromatic ring tetracarboxylic dianhydride such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxylphenyl)sulfone dianhydride, bis(3,4-dicarboxyphenyl)ether dianhydride, 1,2,5,6-naphthalenetetracarboxylic dianhydride, 9,9-bis(3,4-dicarboxyphenyl)fluorenic dianhydride, 9,9-bis{4-(3,4-dicarboxyphenoxy)phenyl}fluorenic dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, and the like or an alicyclic tetracarboxylic dianhydride such as 1,2,3,4-cyclobutanetetracarboxylic dianhydride, 1,2,3,4-cyclopentanetetracarboxylic dianhydride, 1,2,3,4-cyclohexanetetracarboxylic dianhydride, and the like or 3,3',4,4'-diphenylsulfonetetracarboxylic dianhydride or the like.

For example, the polymerization may be performed at a temperature of 100 to 130° C. or 110 to 120° C. for 2 to 24 hours or 4 to 12 hours.

For example, the carboxylic dianhydride may be added in an amount of 5 to 40 parts by weight, 10 to 30 parts by weight, or 10 to 20 parts by weight with respect to 100 parts by weight of monomers represented by Formulas 16 to 20.

For example, a method of preparing a cardo-based binder resin including at least one of the repeating units represented by Formulas 5 and 6 may include a step of adding and reacting an end-capping agent after initiation of the polymerization reaction.

For example, the end-capping reaction may be performed at 100 to 130° C. or 110 to 120° C. for 30 minutes to 4 hours or 1 to 3 hours.

For example, the end-capping agent may be added in an amount of 2 to 10 parts by weight, 2 to 5 parts by weight, or 3 to 5 parts by weight with respect to 100 parts by weight of monomers represented by Formulas 16 to 20.

For example, the end-capping agent is preferably an aromatic carboxylic anhydride, and specific examples thereof include phthalic anhydride and the like. In this case, heat resistance, transparency and refractivity are excellent.

For example, the weight-average molecular weight of a cardo-based binder resin including at least one of the repeating units represented by Formulas 5 and 6 may be 1,000 to 100,000 g/mol, preferably 2,000 to 50,000 g/mol, more preferably 3,000 to 10,000 g/mol. Within this range, heat resistance is excellent, and the developing speed of a photosensitizer and the development in a developing solution are appropriate, and thus pattern formation is good and a residual film ratio is high.

The weight-average molecular weight may be measured by gel permeation chromatography (GPC).

For example, the dispersion degree of a cardo-based binder resin including at least one of the repeating units represented by Formulas 5 and 6 may be a range of 1.0 to 5.0, preferably 1.5 to 4.0. Within this range, heat resistance is excellent, and the developing speed of a photosensitizer and the development in a developing solution are appropriate, and thus pattern formation is good and a residual film ratio is high.

The dispersion degree in the present invention may be measured by a GPC measurement method.

In yet another embodiment of the present invention, the alkali-soluble resin may further include an acrylic binder resin. When the alkali-soluble resin further includes the acrylic binder resin, the resolution and shape of pattern may advantageously be controlled.

For example, the acrylic binder resin includes a carboxyl group-containing monomer, a copolymer of this monomer and other monomers copolymerizable therewith, and the like.

For example, the carboxyl group-containing monomer includes an unsaturated monocarboxylic acid or an unsaturated carboxylic acid such as an unsaturated polycarboxylic acid having one or more carboxyl groups in molecules such as an unsaturated dicarboxyl acid and an unsaturated tricarboxylic acid. For example, the unsaturated monocarboxylic acid includes acrylic acid, methacrylic acid, crotonic acid, α-chloroacrylic acid, cinnamic acid, and the like. For example, the unsaturated dicarboxyl acid includes maleic acid, fumaric acid, itaconic acid, citraconic acid, mesaconic acid, and the like. The unsaturated polycarboxylic acid may be an acid anhydride, and specific examples thereof include maleic anhydride, itaconic anhydride, citraconic anhydride, and the like. In addition, the unsaturated polycarboxylic acid may be a mono(2-methacryloyloxyalkyl)ester thereof, and for example, includes succinic acid mono(2-acryloyloxyethyl), succinic acid mono(2-methacryloyloxyethyl), phthalic acid mono(2-acryloyloxyethyl), phthalic acid mono (2-methacryloyloxyethyl), and the like.

The unsaturated polycarboxylic acid may be a mono (meth)acrylate having dicarboxylic polymers at both ends thereof, and for example, may include ω-carboxypolycaprolactone monoacrylate, ω-carboxypolycaprolactone monomethacrylate, and the like. These carboxyl group-containing monomers may be used alone or in combination of two or more thereof.

For example, other monomers copolymerizable with the carboxyl group-containing monomer include aromatic vinyl compounds such as styrene, α-methylstyrene, o-vinyltoluene, m-vinyltoluene, p-vinyltoluene, p-chloro styrene, o-methoxystyrene, m-methoxystyrene, p-methoxystyrene, o-vinylbenzylmethylether, m-vinylbenzylmethylether, p-vinylbenzylmethylether, o-vinylbenzylglycidylether, m-vinylbenzylglycidylether, p-vinylbenzylglycidylether, and indene; unsaturated carboxylic acid esters such as methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, cyclohexyl acrylate, cyclohexyl methacrylate, phenyl acrylate, phenyl methacrylate, 2-methoxyethyl acrylate, 2-methoxyethyl methacrylate, 2-phenoxyethyl acrylate, 2-phenoxyethyl methacrylate, methoxydiethyleneglycol acrylate, methoxydiethyleneglycol methacrylate, methoxytriethyleneglycol acrylate, methoxytriethyleneglycol methacrylate, methoxypropyleneglycol acrylate, methoxypropyleneglycol methacrylate, methoxydipropyleneglycol acrylate, methoxydipropyleneglycol methacrylate, isobornyl acrylate, isobornyl methacrylate, dicyclopentadienyl acrylate, dicyclopentadiethyl methacrylate, adamantyl(meth)acrylate, norbornyl(meth)acrylate, 2-hydroxy-3-phenoxypropyl acrylate, 2-hydroxy-3-phenoxypropyl methacrylate, glycerol monoacrylate, and glycerol monomethacrylate; unsaturated carboxylic acid aminoalkylesters such as 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminopropyl acrylate, 2-dimethylaminopropyl methacrylate, 3-aminopropyl acrylate, 3-aminopropyl methacrylate, 3-dimethylaminopropyl acrylate, and 3-dimethylaminopropyl methacrylate; unsaturated carboxylic acid glycidylesters such as glycidyl acrylate and glycidyl methacrylate; carboxylic acid vinylesters such as vinyl acetate, vinyl propionate, vinyl butyrate, and vinyl benzoate; unsaturated ethers such as vinylmethylether, vinylethylether, and allylglycidylether; cyanide vinyl compounds such as acrylonitrile, methacrylonitrile, α-chloroacrylonitrile, and cyanide vinylidene; unsaturated amides such as acrylamide, methacrylamide, α-chloroacrylamide, N-2-hydroxyethylacrylamide, and N-2-hydroxyethylmethacrylamide; unsaturated imides such as maleimide, benzylmaleimide, N-phenylmaleimide, and N-cyclohexylmaleimide; aliphatic conjugated dienes such as; 1,3-butadiene, isoprene, and chloroprene; and macromonomers having a monoacryloyl group or a monomethacryloyl group at the end of the molecular chain of a polymer such as polystyrene, polymethyl acrylate, polymethyl methacrylate, poly-n-butyl acrylate, poly-n-butyl methacrylate, and polysiloxane. These monomers may be used alone or in combination of two or more thereof.

In particular, as other monomers copolymerizable with the carboxyl group-containing monomer, bulk monomers such as monomers having a norbornyl skeleton, monomers having an adamantane skeleton, monomers having a rosin skeleton, and the like are preferable, because the bulk monomers have a tendency to lower a relative dielectric constant.

For example, the acrylic binder resin may be contained in an amount of 1 to 50 parts by weight, preferably 3 to 40 parts by weight, more preferably 5 to 30 parts by weight, with respect to 100 parts by weight of the total alkali-soluble resin. In this case, the solubility in a developing solution is sufficient, residues on the substrate of a non-pixel portion are hardly generated, and it is easy to adjust the resolution and the pattern shape of a pixel pattern.

The content of the alkali-soluble resin is usually 5 to 85 parts by weight, preferably 10 to 70 parts by weight with respect to 100 parts by weight of the total solid content of the photosensitive resin composition. When the content of the alkali-soluble resin satisfies the above-mentioned range, solubility in a developing solution is sufficient, so that development residues are hardly generated, and the film of the pixel portion of an exposed portion is hardly reduced during development, so that a non-pixel portion is easily omitted.

Quantum Dots

Quantum dots included in the self-emissive photosensitive resin composition of the present invention are nanoscale semiconductor materials. Atoms form a molecule, and molecules form an assembly of small molecules called a cluster to form nanoparticles. These nanoparticles are called quantum dots, especially when the nanoparticles have the characteristics of a semiconductor. These quantum dots have a characteristic of releasing energy corresponding to an energy band gap when the quantum dots reach an excited state by receiving energy from the outside. In summary, when the self-emissive photosensitive resin composition of the present invention includes the quantum dots, the composition may be self-emissive.

In a conventional image display device including a color filter, white light is transmitted through the color filter to realize color. In this process, a part of light is absorbed by the color filter, so that luminous efficacy is lowered. However, when an image display device includes a color filter prepared using the self-emissive photosensitive resin composition according to the present invention, the color filter self-emits light by the light emitted by a light source, and thus, excellent luminous efficacy may be realized. In addition, since colored light is emitted, color reproducibility is excellent, and a viewing angle may be improved because light is emitted in all directions by optical luminescence.

The quantum dots are not particularly limited as long as the quantum dots may emit light by an optical stimulus, and for example, at least one of group II-VI semiconductor compounds, group III-V semiconductor compounds, group IV-VI semiconductor compounds, and group IV elements or compounds including group IV elements may be used as the quantum dots.

The group II-VI semiconductor compounds may be at least one species selected from the group consisting of a binary compounds selected from the group consisting of CdS, CdSe, CdTe, ZnS, ZnSe, ZnTe, ZnO, HgS, HgSe, HgTe, and mixtures thereof; a ternarycompounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and mixtures thereof; and a quaternary compounds selected from the group consisting of CdZnSeS, CdZnSeTe, CdZnSTe, CdHgSeS, CdHgSeTe, CdHgSTe, HgZnSeS, HgZnSeTe, HgZnSTe, and mixtures thereof, The group III-V semiconductor compounds may be at least one species selected from the group consisting of a binary compounds selected from the group consisting of GaN, GaP, GaAs, GaSb, AN, AlP, AlAs, AlSb, InN, InP, InAs, InSb, and mixtures thereof; a ternary compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and a quaternary compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof, The group IV-VI semiconductor compounds may be at least one species selected from the group consisting of a binary compounds selected from the group consisting of SnS, SnSe, SnTe, PbS, PbSe, PbTe, and mixtures thereof; a ternary compounds selected from the group consisting of SnSeS, SnSeTe, SnSTe, PbSeS, PbSeTe, PbSTe, SnPbS, SnPbSe, SnPbTe, and mixtures thereof; and a quaternary compounds selected from the group consisting of SnPbSSe, SnPbSeTe, SnPbSTe, and mixtures thereof, The group IV elements or compounds including the same may be at least one species selected from the group consisting of elemental compounds selected from the group consisting of Si, Ge, and mixtures thereof; and a binary compounds selected from the group consisting of SiC, SiGe, and mixtures thereof, without being limited thereto.

The quantum dots may have a homogeneous single structure; a dual structure such as a core-shell structure, a gradient structure or the like; or a mixed structure thereof. For example, in the core-shell structure, each material constituting a core and a shell may be made of the above-mentioned different semiconductor compounds. More specifically, the core may include one or more materials selected from the group consisting of CdSe, CdS, ZnS, ZnSe, CdTe, CdSeTe, CdZnS, PbSe, AgInZnS, and ZnO, without being limited thereto. The shell may include one or more materials selected from the group consisting of CdSe, ZnSe, ZnS, ZnTe, CdTe, PbS, TiO, SrSe, and HgSe, without being limited thereto.

A coloring photosensitive resin composition used for preparing a typical color filter includes red, green, and blue coloring agents for color implementation. In addition, optical luminescence quantum dots may be classified into red quantum dots, green quantum dots, and blue quantum dots. In short, the quantum dots according to the present invention may be red quantum dots emitting red light, green quantum dots emitting green light, or blue quantum dots emitting blue light.

The quantum dots may be synthesized by a wet chemical process, a metal-organic chemical vapor deposition (MOCVD) process or a molecular beam epitaxy (MBE) process, without being limited thereto.

The wet chemical process is a method of growing particles by adding a precursor material to an organic solvent. When crystals are grown, the organic solvent is naturally coordinated to the surfaces of quantum dot crystals and acts as a dispersant to control crystal growth. Accordingly, the growth of nanoparticles may be controlled through an easier and less expensive process than vapor deposition methods such as metal-organic chemical vapor deposition or molecular beam epitaxy. Therefore, it is preferable to prepare the quantum dots according to the present invention using the wet chemical process.

The content of the quantum dots is not particularly limited in the present invention, and is 3 to 80 parts by weight, preferably 5 to 70 parts by weight, with respect to 100 parts by weight of the total solid content of the self-emissive photosensitive resin composition. When quantum dots are included within the above range, light emitting efficiency is excellent and a pixel pattern may be easily formed. When the quantum dots are included below the above-mentioned range, the efficiency of light emission may be insufficient. When the content of the quantum dots exceeds the above-mentioned range, pixel pattern formation may be somewhat difficult because the content of other components is insufficient. Therefore, it is preferable that above range is satisfied.

The quantum dots are mixed with a solvent to prepare a quantum dot dispersion, and then the quantum dot dispersion may be included in the self-emissive photosensitive resin composition. In this case, a dispersing agent for dispersing the quantum dots may be added, but the present invention is not limited thereto. The dispersing agent and the solvent contained in the dispersion may be dispersing agents known in the art, without being limited thereto.

Scattering Particles

The self-emissive photosensitive resin composition according to the present invention may include scattering particles. As the scattering particles, a conventional inorganic material may be used, and metal oxides having an average particle diameter of 30 to 1000 nm may be included.

The metal oxide may be an oxide including one metal selected from the group consisting of Li, Be, B, Na, Mg, Al, Si, K, Ca, Sc, V, Cr, Mn, Fe, Ni, Cu, Zn, Ga, Ge, Rb, Sr, Y, Mo, Cs, Ba, La, Hf, W, Tl, Pb, Ce, Pr, Nd, Pm, Sm, Eu, Gd, Tb, Dy, Ho, Er, Tm, Yb, Ti, Sb, Sn, Zr, Nb, Ce, Ta, In, and combinations thereof, without being limited thereto.

Specifically, as the metal oxide, one species selected from the group consisting of $Al_2O_3$, $SiO_2$, ZnO, $ZrO_2$, $BaTiO_3$, $TiO_2$, $Ta_2O_5$, $Ti_3O_5$, ITO, IZO, ATO, ZnO—Al, $Nb_2O_3$, SnO, MgO, and combinations thereof may be used. When necessary, a metal oxide surface-treated with a compound having an unsaturated bond such as an acrylate may be used.

However, when the self-emissive photosensitive resin composition according to the present invention includes scattering particles, the path of light spontaneously emitted from quantum dots may be increased through the scattering particles. As a result, the overall luminous efficacy in a color filter may be increased.

Preferably, scattering particles have an average particle diameter of 30 to 1000 nm, more preferably 100 to 500 nm. In this case, when the particle size is too small, the scattering effect of light emitted from quantum dots may not be sufficient. On the contrary, when the particle size is too large, the particles may sink into a composition, and the surface of a self-emission layer may not be uniform. Therefore, it is preferable to adjust the size appropriately within the above range.

The scattering particles may be used in an amount of 0.1 to 50 parts by weight, preferably 0.5 to 30 parts by weight, with respect to 100 parts by weight of the total self-emissive photosensitive resin composition. When the scattering particles are included within the above range, an increase in luminescence intensity may be maximized. When the amount of the scattering particles is less than the above range, it may be difficult to obtain a desired luminescence intensity. When the amount of the scattering particles exceeds the above range, an additional increase in luminescence intensity is insufficient, and the stability of a composition may deteriorate. Therefore, it is preferable to appropriately use scattering particles within the above range.

Photopolymerizable Compound

A photopolymerizable compound in the present invention is a compound which may be polymerized by the action of light and a photopolymerization initiator described below, and examples thereof include a monofunctional monomer, a bifunctional monomer, other multifunctional monomers, and the like. It is preferable to use a monomer having a functionality of two or more.

The type of monofunctional monomer is not particularly limited, and examples thereof include nonylphenylcarbitol acrylate, 2-hydroxy-3-phenoxypropyl acrylate, 2-ethylhexylcarbitol acrylate, 2-hydroxyethyl acrylate, N-vinylpyrrolidone, and the like.

The type of bifunctional monomer is not particularly limited, and examples thereof include 1,6-hexanedioldi(meth)acrylate, ethyleneglycoldi(meth)acrylate, neopentylglycol di(meth)acrylate, triethyleneglycoldi(meth)acrylate, bis(acryloyloxyethyl)ether of bisphenol A, 3-methylpentanedioldi(meth)acrylate, and the like.

The type of multifunctional monomer is not particularly limited, and examples thereof include trimethylolpropanetri(meth)acrylate, ethoxylated trimethylolpropanetri(meth)acrylate, propoxylated trimethylolpropanetri(meth)acrylate, pentaerythritoltri(meth)acrylate, pentaerythritoltetra(meth)acrylate, dipentaerythritoltri(meth)acrylate, dipentaerythritolpenta(meth)acrylate, ethoxylated dipentaerythritolhexa(meth)acrylate, propoxylated dipentaerythritolhexa(meth)acrylate, dipentaerythritolhexa(meth)acrylate, and the like.

The photopolymerizable compound may be contained in an amount of 1 to 45 parts by weight with respect to 100 parts by weight of the total composition. Preferably, the photopolymerizable compound is contained in an amount of 1 to 20 parts by weight. When the amount is less than the above range, photosensitivity may be lowered. On the other hand, when the amount exceeds the above range, a photosensitive resin layer becomes excessively sticky, the strength of a film becomes insufficient, and a pattern may be lost during development.

Photopolymerization Initiator

A photopolymerization initiator in the present invention is a compound for initiating polymerization of the photopolymerizable compound described above, and is not particularly limited. For example, the photopolymerization initiator may include acetophenone-based, benzophenone-based, triazine-based, thioxanthone-based, oxime-based, benzoin-based, anthracene-based, anthraquinone-based, and nonimidazole-based compounds, and the like, and these may be used alone or in combination of two or more.

The acetophenone-based compound may include oligomers of diethoxyacetophenone, 2-hydroxy-2-methyl-1-phenylpropan-1-one, benzyl dimethyl ketal, 2-hydroxy-1-[4-(2-hydroxyethoxy)phenyl]-2-methylpropan-1-one, 1-hydroxycyclohexylphenylketone, 2-methyl-1-(4-methylthiophenyl)-2-morpholinopropan-1-one, 2-benzyl-2-dimethylamino-1-(4-morpholinophenyl)butan-1-one, 2-hydroxy-2-methyl[4-(1-methylvinyl)phenyl]propan-1-one, and the like. Of these, 2-benzyl-2-dimethylamino-1-(4-morpholinophenyl)butan-1-one is preferably used.

The benzophenone-based compound may include benzophenone, benzoylbenzoate, methyl benzoylbenzoate, 4-phenyl benzophenone, hydroxybenzophenone, acrylated benzophenone, 4,4'-bis(dimethyl amino)benzophenone, 4,4'-bis(diethyl amino) benzophenone, and the like.

The triazine-based compound may include 2,4,6-trichloro-s-triazine, 2-phenyl-4,6-bis(trichloro methyl)-s-triazine, 2-(3',4"-dimethoxy styryl)-4,6-bis(trichloro methyl)-s-triazine, 2-(4'-methoxy napthyl)-4,6-bis(trichloro methyl)-s-triazine, 2-(p-methoxy phenyl)-4,6-bis(trichloro methyl)-s-triazine, 2-(p-trill)-4,6-bis(trichloro methyl)-s-triazine, 2-biphenyl-4,6-bis(trichloro methyl)-s-triazine, bis(trichloro methyl)-6-styryl-s-triazine, 2-(naphtho 1-i1)-4,6-bis(trichloro methyl)-s-triazine, 2-(4-methoxy naphtho 1-i1)-4,6-bis(trichloro methyl)-s-triazine, 2,4-trichloro methyl(piperonyl)-6-triazine, 2,4-trichloro methyl(4'-methoxy styryl)-6-triazine, and the like.

The thioxanthone-based compound may include 2-isopropylthioxanthone, 2,4-diethylthioxanthone, 2,4-dichlorothioxanthone, 1-chloro-4-propoxythioxanthone, and the like.

The oxime-based compound may include o-ethoxycarbonyl-α-oxyimino-1-phenylpropan-1-one, and the like, and commercial products such as CIBA's OXE-01, OXE-02, and OXE-03 are representative.

The benzoin-based compound may include benzoin methyl ether, benzoin ethyl ether, benzoin isopropyl ether, benzoin isobutyl ether, benzyl dimethyl ketal, and the like.

The anthracene-based compound may include 9,10-dimethoxyanthracene, 2-ethyl-9,10-dimethoxyanthracene, 9,10-diethoxyanthracene, 2-ethyl-9,10-diethoxyanthracene, and the like.

The anthraquinone-based compound may include 2-ethyl anthraquinone, octamethyl anthraquinone, 1,2-benz anthraquinone, 2,3-diphenyl anthraquinone, and the like.

The non-imidazole-based compound may include 2,2'-bis (2-chlorophenyl)-4,4',5,5"-tetraphenylnon-imidazole, 2,2'-bis (2,3-dichlorophenyl)-4,4 ',5,5"-tetraphenylnon-imidazole, 2,2'-bis(2-chlorophenyl)-4,4',5,5"-tetra(alkoxyphenyl) non-imidazole, 2,2'-bis(2-chlorophenyl)-4,4',5,5"-tetra (trialkoxyphenyl)non-imidazole, an imidazole compound in which the phenyl group at the 4,4',5,5" position is substituted with a carboalkoxy group, and the like.

Other photopolymerization initiators may include 2,4,6-trimethylbenzoyldiphenylpho sphine oxide, 10-butyl-2-chloroacridon, 9,10-phenanthrenequinone, camphorquinone, methyl phenylglyoxylate, a titanocene compound, and the like.

The photopolymerization initiator may be included in an amount of 0.1 to 20 parts by weight, preferably 0.5 to 15 parts by weight, with respect to 100 parts by weight of the total composition.

When the amount of the photopolymerization initiator is within the above range, the self-emissive photosensitive resin composition is highly sensitized, and thereby the strength of a pixel portion and the smoothness of the surface of the pixel portion are improved. In addition, when the amount of a photopolymerization initiation auxiliary agent is within the above range, the sensitivity of the self-emissive photosensitive resin composition may be further increased, and the productivity of a color filter formed using the composition may be improved.

In addition, when the photopolymerization initiator and the photopolymerization initiation auxiliary agent are included in the self-emissive photosensitive resin composition, the composition becomes more sensitive, and productivity may be improved when the color filter is formed.

As a usable photopolymerization initiation auxiliary agent, one species selected from the group consisting of an amine compound, a carboxylic acid compound, and combinations thereof may be preferably used.

For example, the amine compound may include aliphatic amine compounds such as triethanolamine, methyldiethanolamine, and triisopropanolamine; and aromatic amine compounds such as methyl 4-dimethylaminobenzoate, ethyl 4-dimethylaminobenzoate, isoamyl 4-dimethylaminobenzoate, 2-ethylhexyl 4-dimethylaminobenzoate, 2-dimethylaminoethyl benzoate, N,N-dimethyl para-toluidine, 4,4'-bis(dimethylamino)benzophenone (common name: Michler's ketone), and 4,4'-bis(diethylamino)benzophenone. Preferably, an aromatic amine compound is used as the amine compound.

For example, the carboxylic acid compound may include aromatic heteroacetic acids such as phenylthioacetic acid, methylphenylthio acetic acid, ethylphenylthio acetic acid, methylethylphenylthioacetic acid, dimethylphenylthioacetic acid, methoxyphenylthioacetic acid, dimethoxyphenylthioacetic acid, chlorophenylthio acetic acid, dichlorophenylthioacetic acid, N-phenylglycine, phenoxyacetic acid, napthylthioacetic acid, N-napthylglycine, and naphthoxyacetic acid.

The photopolymerization initiation auxiliary agent is preferably used in an amount of 10 moles or less, preferably 0.01 to 5 moles, per 1 mole of the photopolymerization initiator. When the amount of the photopolymerization initiation auxiliary agent is used within the above range, polymerization efficiency may be increased, and productivity may be improved.

Solvent

Any solvent capable of dissolving or dispersing the above-mentioned composition may be used as the solvent of the present specification, and the solvent is not particularly limited in the present invention. For example, representative solvents are akyleneglycol monoalkyl ethers, akyleneglycol alkyl ether acetates, aromatic hydrocarbons, ketones, lower and higher alcohols, cyclic esters, and the like. More specifically, the solvent may include akyleneglycol monoalkyl ethers such as ethyleneglycol monomethyl ether, ethyleneglycol monoethyl ether, ethyleneglycol monopropyl ether, and ethyleneglycol monobutyl ether; diethyleneglycol dialkyl ethers such as diethyleneglycol dimethyl ether, diethyleneglycol diethyl ether, diethyleneglycol dipropyl ether, and diethyleneglycol dibutyl ether; akyleneglycol alkyl ether acetates such as methyl cello solve acetate, ethyl cello solve acetate, propyleneglycol monomethyl ether acetate, propyleneglycol monoethyl ether acetate, propyleneglycol monopropyl ether acetate, methoxybutyl acetate, and methoxypentyl acetate; aromatic hydrocarbons such as benzene, toluene, xylene, and mesitylene; ketones such as methylethylketone, acetone, methylamylketone, and methylisobutylketone, cyclohexanone; alcohols such as ethanol, propanol, butanol, hexanol, cyclohexanol, ethyleneglycol, and glycerin; esters such as ethyl 3-ethoxypropionate, and methyl 3-methoxypropionate; and cyclic esters such as γ-butyrolactone.

Among the above-mentioned solvents, it is preferable to use an organic solvent having a boiling point of 100 to 200° C. in consideration of coating and drying properties. Preferably, akyleneglycol alkyl ether acetates, ketones, esters such as ethyl 3-ethoxypropionate and methyl 3-methoxypropionate are used as the solvent. More preferably, propyleneglycol monomethyl ether acetate, propyleneglycol monoethyl ether acetate, cyclohexanone, ethyl 3-ethoxypropionate, methyl 3-methoxypropionate, and the like are used as the solvent. These solvents may be used alone or in combination of two or more.

Such a solvent may be used as a remainder to satisfy 100 parts by weight of the total composition. This content was determined in consideration of the dispersion stability of the composition and the ease of processing in the manufacturing process (for example, coating property).

Additives

The self-emissive photosensitive resin composition according to the present invention may further include known additives for various purposes. For example, fillers, other polymer compounds, curing agents, adhesion promoters, antioxidants, ultraviolet ray absorbents, anti-aggregation agents, and the like may be used as the additives. One or more of these additives may be used, and it is preferably used in an amount of 1% by weight or less in the whole composition in consideration of luminous efficacy, and the like.

The fillers may include glass, silica, alumina, and the like, and the other polymer compounds may include curing agents such as epoxy resins and maleimide resins and thermoplastic resins such as polyvinylalcohol, polyacrylic acid, polyethyleneglycol monoalkylether, polyfluoroalkyl acrylate, polyester, and polyurethane.

Specifically, the other polymer compounds may include thermosetting resins such as epoxy resins, maleimide resins and thermoplastic resins such as polyvinylalcohol, polyacrylic acid, polyethyleneglycolmonoalkylether, polyfluoroalkylacrylate, polyester, and polyurethane.

The curing agents are used for increasing core curing and mechanical strength, and may include epoxy compounds, multifunctional isocyanate compounds, melamine compounds, and oxetane compounds.

Specific examples of the epoxy compound used as the curing agent may include bisphenol A-based epoxy resins, hydrogenated bisphenol A-based epoxy resins, bisphenol F-based epoxy resins, hydrogenated bisphenol F-based epoxy resins, novolak type epoxy resins, other aromatic epoxy resins, alicyclic epoxy resins, glycidylester-based resins, glycidylamine-based resins, or brominated derivatives of these epoxy resins, epoxy resins and aliphatic, alicyclic or aromatic epoxy compounds other than the brominated derivatives, butadiene (co)polymer epoxides, isoprene (co)polymer epoxides, glycidyl(meth)acrylate (co) polymers, triglycidylisocyanurate, and the like.

Specific examples of the oxetane compounds used as the curing agent may include carbonatebisoxetane, xylenebisoxetane, adipatebisoxetane, terephthalatebisoxetane, cyclohexane dicarboxyl acidbisoxetane, and the like.

A curing auxiliary compound capable of ring-opening polymerization of the epoxy group of the epoxy compound and the oxetane skeleton of the oxetane compound may be used with the curing agent. For example, the curing auxiliary compound may include polyvalent carboxylic acids, polyvalent carboxylic anhydrides, acid generators, and the like.

The carboxylic anhydrides are commercially available as an epoxy resin curing agent. For example, the commercially available epoxy resin curing agent may include product name (ADEKA HARDONA EH-700) (ADEKA INDUSTRIAL CO., LTD.), product name (RICACIDO HH) (New Japan Chemical Co., Ltd.), product name (MH-700) (New Japan Chemical Co., Ltd.), and the like.

The curing agent and the curing auxiliary compound exemplified above may be used alone or in combination of two or more.

For example, the adhesion promoter may include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, and the like.

For example, the antioxidants may include 2,2'-thiobis(4-methyl-6-t-butylphenol), 2,6-di-t-butyl-4-methylphenol, and the like.

For example, the ultraviolet ray absorbers may include 2-(3-tert-butyl-2-hydroxy-5-methylphenyl)-5-chlorobenzotriazole, alkoxybenzophenones, and the like, and the anti-aggregation agents may include sodium polyacrylate and the like.

The additives may be suitably added and used by those skilled in the art within a range not hindering the effect of the present invention. For example, the additives may be used in an amount of 0.05 to 10 parts by weight, preferably 0.1 to 10 parts by weight, more preferably 0.1 to 5 parts by weight, with respect to 100 parts by weight of the total self-emissive photosensitive resin composition, without being limited thereto.

Since the self-emissive photosensitive resin composition according to the present invention may emit light by itself, the composition exhibits excellent color reproducibility. In addition, since the composition includes a cardo-based binder resin including at least one of the repeating units represented by Formulas 1 to 4, a color filter and an image display device having improved surface hardness and chemical resistance may be prepared.

Color Filter

Another aspect of the present invention relates to a color filter prepared using the self-emissive photosensitive resin composition described above.

When the color filter of the present invention is applied to an image display device, the surface hardness of an applied film formed using a specific cardo-based binder resin, specifically a cardo-based binder resin including at least one of the repeating units represented by Formulas 1 to 4, may be improved. In addition, heat resistance and solvent resistance may be improved, and thus, chemical stability may be improved. As a result, reliability and durability may be improved. In addition, since quantum dots are activated by a light source and emit light having color, color reproducibility is excellent.

The color filter may include a substrate and a pattern layer formed on the substrate, and the pattern layer may include the cured product of the self-emissive photosensitive resin composition according to the present invention.

The substrate may be a color filter itself, or may be a portion where a color filter is placed on a display device or the like, and is not particularly limited. For example, the substrate may include glass, silicon (Si), silicon oxide (SiOx) or a polymer substrate, and the polymer substrate may include polyethersulfone (PES), polycarbonate (PC), or the like.

The pattern layer is a layer including the photosensitive resin composition of the present invention, and may be formed by applying the photosensitive resin composition and exposing, developing, and thermal curing the composition according to a predetermined pattern.

The pattern layer formed using the self-emissive photosensitive resin composition may be provided with a red pattern layer containing red quantum dot particles, a green pattern layer containing green quantum dot particles or a blue pattern layer containing blue quantum dot particles. During light irradiation, the red pattern layer may emit red light, the green pattern layer may emit green light, and the blue pattern layer may emit blue light. When the pattern layer is applied to an image display device to be described below, the emitted light of a light source is not particularly limited, but it is preferable to use a light source that emits blue light for better color reproducibility.

In yet another embodiment of the present invention, the pattern layer may include at least one species selected from the group consisting of a red pattern layer, a green pattern layer, and a blue pattern layer. The pattern layer may include only two types of the red pattern layer, the green pattern layer, and the blue pattern layer, and in this case, the pattern layer may further include a transparent pattern layer not containing quantum dot particles. When only two types of pattern layers are provided, a light source that emits light corresponding to the remaining pattern layer not included may be used. For example, when the red pattern layer and the green pattern layer are included, a light source that emits blue light may be used. In this case, the red quantum dot particles emit red light, the green quantum dot particles emit green light, and blue light is transmitted through the transparent pattern layer and the transparent pattern layer exhibits a blue color.

The color filter including the substrate and the pattern layer as described above may further include, but is not limited to, barriers formed between the respective patterns and a black matrix. In addition, a protective film formed on the pattern layer of the color filter may be further included.

Image Display Device

Another aspect of the present invention relates to an image display apparatus including the color filter described above. The color filter of the present invention is applicable not only to a general liquid crystal display device but also to various image display devices such as an electroluminescent display device, a plasma display device, and a field emission display device.

Since the image display device according to the present invention is prepared using the above-described self-emissive photosensitive resin composition, color reproducibility is excellent, and the surface hardness of an applied film formed using the self-emissive photosensitive resin composition is excellent, and chemical resistance is excellent.

Hereinafter, the present invention will be described in detail by describing exemplary embodiments of the invention. However, the invention may be embodied in many different forms and should not be construed as being limited to the embodiments set forth herein. These embodiments are provided to more fully describe the present disclosure to those skilled in the art. In addition, in the following, "%" and "parts" representing the content are by weight unless otherwise specified.

PREPARATION EXAMPLE

Preparation Example 1: Quantum Dots a Having CdSe (Core)/ZnS (Shell) Structure

CdO (0.4 mmol), zinc acetate (4 mmol), oleic acid (5.5 mL), and 1-octadecene (20 mL) were added to a reactor and reacted by heating to 150° C. After the reaction, the reaction mixture was allowed to stand under a vacuum of 100 mTorr for 20 minutes to remove acetic acid generated by the displacement of oleic acid into zinc.

Thereafter, the reaction mixture was heated to 310° C. to obtain a transparent mixture, and the transparent mixture was maintained at 310° C. for 20 minutes. Then, a Se and S solution, in which 0.4 mmol of Se powder and 2.3 mmol of S powder were dissolved in 3 mL of trioctylphosphine, was rapidly injected into a reactor containing a Cd(OA)$_2$ and Zn(OA)$_2$ solution. The resulting mixture was grown at 310° C. for 5 minutes, and then growth was stopped in an ice bath.

Thereafter, following ethanol precipitation, quantum dots were separated by centrifugation, excess impurities were washed with chloroform and ethanol. As a result, quantum dots A, which were composed of particles having a CdSe (core)/ZnS (shell) structure and were stabilized with oleic acid, were obtained. Specifically, the sum of the core particle diameter and the shell thickness was 3 to 5 nm.

Preparation Example 2

Quantum Dots B Having InP (Core)/ZnS (Shell) Structure 0.2 mmol (0.058 g) indium acetate, 0.6 mmol (0.15 g) palmitic acid, and 1-octadecene (10 mL) were added into a reactor and heated to 120° C. under vacuum. After 1 hour, an atmosphere in the reactor was replaced with nitrogen. Then, after heating to 280° C., a mixed solution of 0.1 mmol (29 µL) tris(trimethylsilyl)phosphine (TMS3P) and 0.5 mL of trioctylphosphine was rapidly injected into the reactor and reaction was performed for 20 minutes. The reaction solution was quickly cooled to room temperature, acetone was added, and the mixture was centrifuged to obtain a precipitate. The precipitate was dispersed in toluene. The obtained InP semiconductor nanocrystals exhibited a UV absorption maximum wavelength of 560 to 590 nm.

1.2 mmol (0.224 g) zinc acetate, 2.4 mmol oleic acid, and 10 mL of trioctylamine were added into a reactor, and heated to 120° C. under vacuum. After 1 hour, an atmosphere in the reactor was replaced with nitrogen, and the reactor was heated to 280° C. 1 mol of the synthesized InP core solution was added into the reactor, and subsequently, 2.4 mmol sulfur (S)/trioctylphosphine (TOP) was added thereto. Then, the final mixture was reacted for 2 hours. The reaction solution was quickly cooled to room temperature, ethanol was added, and centrifugation was performed. As a result, quantum dots B exhibiting an emission wavelength of 636 nm and having a InP (core)/ZnS (shell) structure were obtained.

Preparation Example 3

Quantum Dot Dispersion A-1

25.0 parts by weight of the quantum dots A of Preparation Example 1, 6 parts by weight of Aji Spa PB-821 as a dispersing agent, and 69 parts by weight of propylene glycol monomethyl ether acetate as a solvent were mixed and dispersed in a bead mill for 12 hours to prepare quantum dot dispersion A-1.

Preparation Example 4

Quantum Dot Dispersion A-2

25.0 parts by weight of the quantum dots B of Preparation Example 2, 6 parts by weight of Aji Spa PB-821 as a dispersing agent, and 69 parts by weight of propylene glycol monomethyl ether acetate as a solvent were mixed and dispersed in a bead mill for 12 hours to prepare quantum dot dispersion A-2.

Synthesis Example of Alkali-Soluble Resin

Synthesis Example 1

Cardo-Based Binder Resin (E-1)—Example 1

(1) 138 g of 9,9'-bis(4-glysiloxyphenyl)fluorene (HEAR CHEM. Co.) as a bisphenol epoxy compound, 54 g of 2-carboxyethyl acrylate, 1.4 g of benzyltriethylammonium chloride (DAEJUNG CHEM. Co.), 1 g of triphenylphosphine (ALDRICH Co.), 128 g of propyleneglycol methylethyl acetate (DAICEL CHEM. Co.), and 0.5 g of hydroquinone were added to a reactor, and heated to 120° C. and the temperature was maintained for 12 hours to synthesize a compound represented by Formula 21 below.

(2) 60 g of the compound represented by Formula 21, 11 g of biphenyltetracarboxylic dianhydride (MITSUBISHI GAS Co.), 3 g of tetrahydrophthal anhydride (ALDRICH Co.), 20 g of propyleneglycol methylethyl acetate (DAICEL CHEM. Co.), and 0.1 g of N,N'-tetramethylammonium chloride were added to a reactor, and heated to 120° C. and the temperature was maintained for 2 hours to synthesize a compound represented by Formula 22 below. The weight-average molecular weight of the obtained resin represented by Formula 22 was 5,400 g/mol.

Formula 21
Formula 22
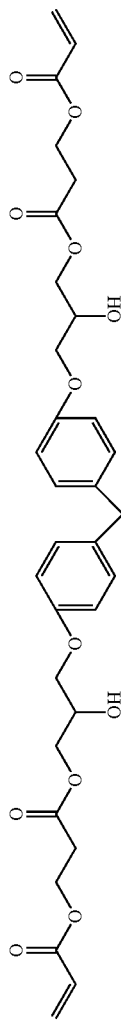
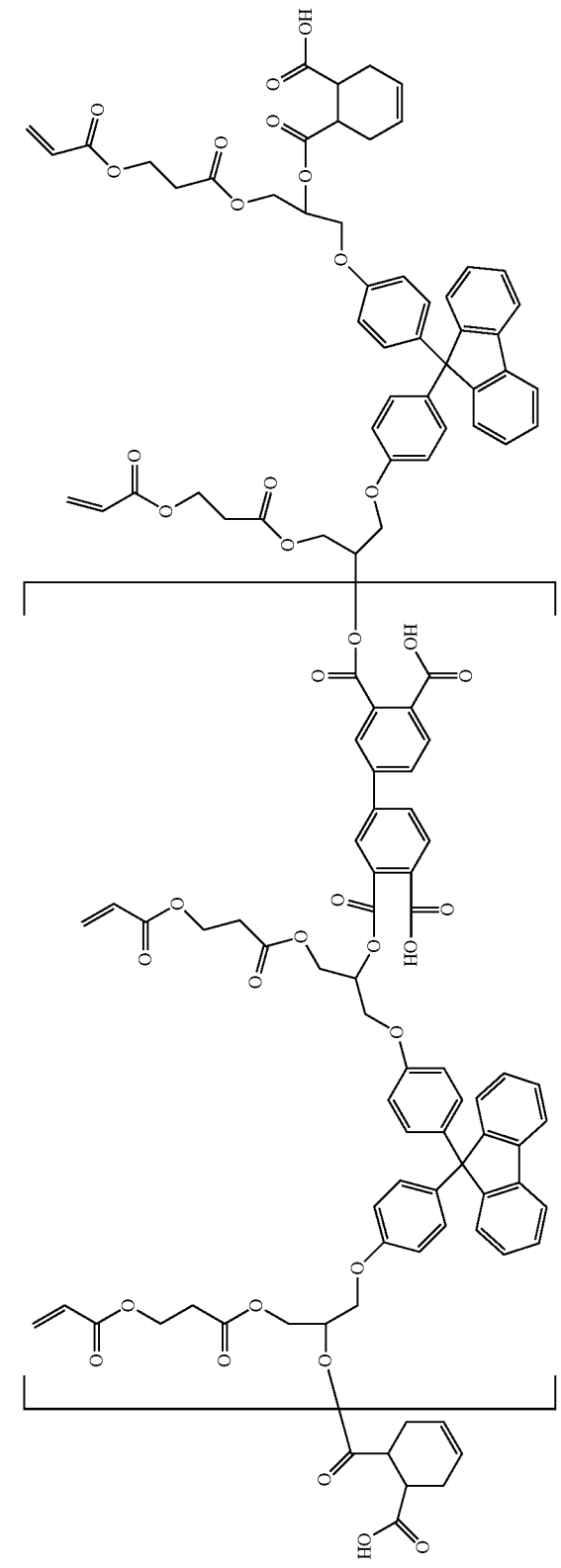

Synthesis Example 2

Cardo-Based Binder Resin (E-2)—Example 2

(1) 138 g of 9,9'-bis(4-glysiloxyphenyl)fluorene (HEAR CHEM. Co.) as a bisphenol epoxy compound, 54 g of mono-2-acryloyloxyethyl succinate, 1.4 g of benzyltriethylammonium chloride (DAEJUNG CHEM. Co.), 1 g of triphenylphosphine (ALDRICH Co.), 128 g of propyl glycol methyl ethyl acetate (DAICEL CHEM. Co.), and 0.5 g of hydroquinone were added to a reactor, and heated to 120° C. and the temperature was maintained for 12 hours to synthesize a compound represented by Formula 23 below.

(2) 60 g of the compound represented by Formula 23, 11 g of biphenyltetracarboxylic dianhydride (MITSUBISHI GAS Co.), 3 g of tetrahydrophthal anhydride (ALDRICH Co.), 20 g of propyl glycol methyl ethyl acetate (DAICEL CHEM. Co.), and 0.1 g of N,N'-tetramethylammonium chloride were added to a reactor, and heated to 120° C. and the temperature was maintained for 2 hours to synthesize a compound represented by Formula 24 below. The weight-average molecular weight of the obtained resin represented by Formula 24 was 5,400 g/mol.

Formula 23
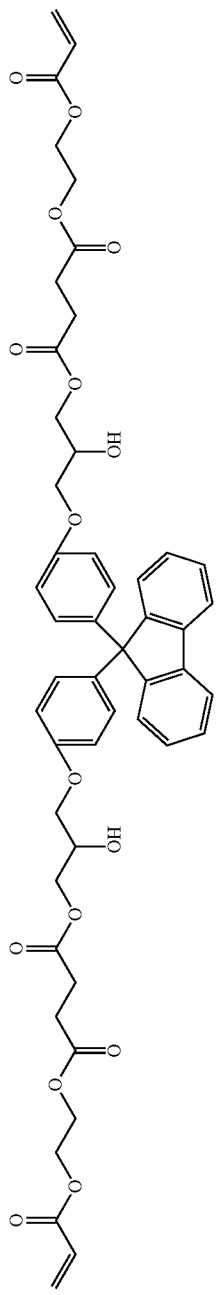
Formula 24
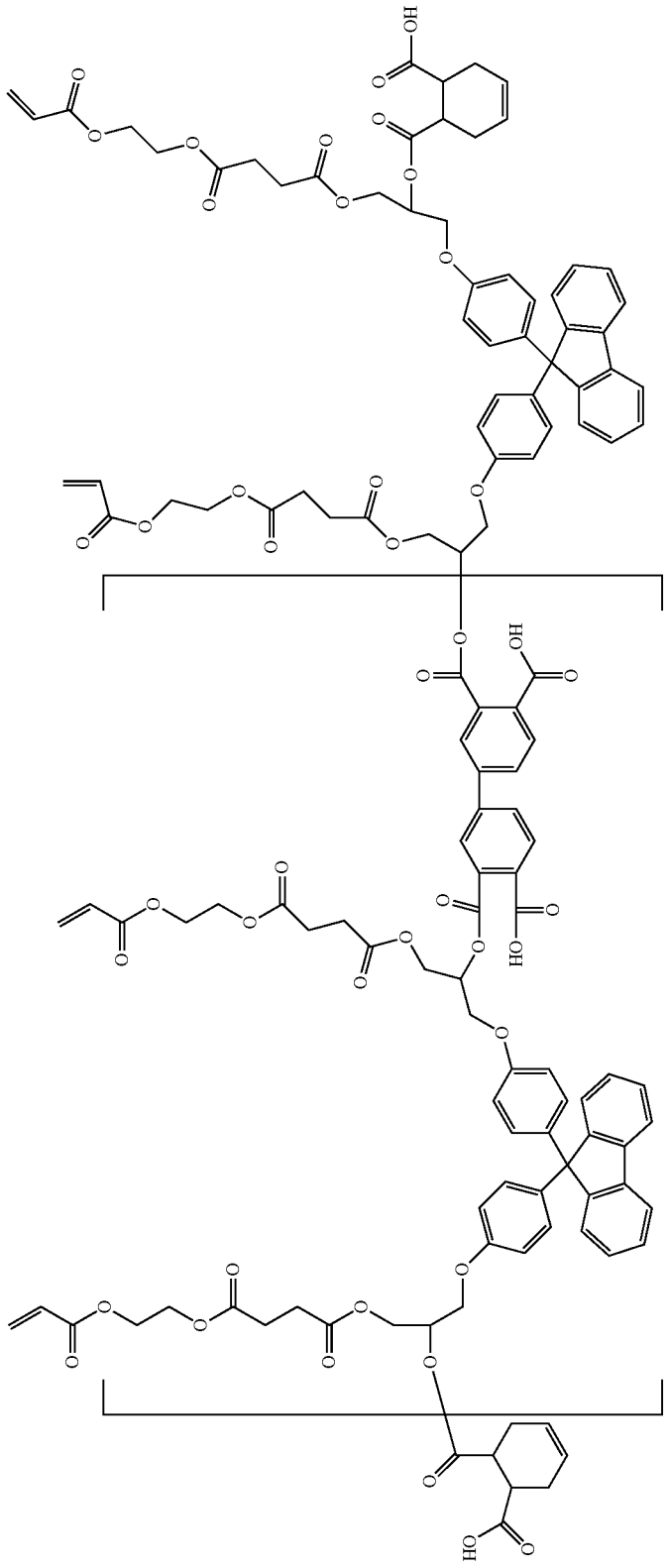

Synthesis Example 3

Cardo-Based Binder Resin (E-3)—Example 3

(1) To synthesize a compound represented by Formula 25, 364.4 g of 3',6'-dihydroxyspiro(fluorene-9,9-xanthene) and 0.4159 g of t-butylammonium bromide were added to a 3000 ml three-neck round bottom flask and mixed, and 2359 g of epichlorohydrin was added thereto, and then reaction was performed by heating the mixture to 90° C. When liquid chromatography analysis confirmed that 3,6-dihydroxyspiro(fluorene-9,9-xanthene) was completely consumed, the mixture was cooled to 30° C. and a 50% NaOH aqueous solution (3 equivalent) was slowly added to the mixture. When liquid chromatography analysis confirmed that epichlorohydrin was completely consumed, extraction was performed using dichloromethane. After extraction, washing was performed three times, an organic layer was dried using magnesium sulfate, dichloromethane was distilled under reduced pressure, and recrystallization was performed using a 50:50 mixture of dichloromethane and methanol.

1 equivalent of the synthesized epoxy compound and 0.004 equivalents of t-butylammonium bromide, 0.001 equivalents of 2,6-diisobutylphenol, and 2.2 equivalents of acrylic acid were mixed, and 24.89 g of propylene glycol monomethyl ether acetate as a solvent was added thereto and mixed. The reaction solution was heated to 90 to 100° C. while blowing air at a rate of 25 ml/min to perform dissolution. The reaction solution in a cloudy state was heated to 120° C. to completely dissolve the reaction solution. When the solution became clear and had a high viscosity, the acid value was measured and the solution was stirred until the acid value became less than 1.0 mg KOH/g. Stirring for 11 hours was required until the acid value reached a target value (0.8). After completion of the reaction, the temperature of the reactor was lowered to room temperature to obtain a colorless, transparent compound.

consumed, 38.0 g of 1,2,3,6-tetrahydrophthalic anhydride was added and the mixture was reacted at 90° C. for 6 hours to polymerize a cardo-based binder resin. Consumption of the anhydride was confirmed by an IR spectrum.

Synthesis Example 4

Cardo-Based Binder Resin (E-4)—Example 4

(1) To synthesize a compound represented by Formula 26, 364.4 g of 4,4'-(9H-xanthene-9,9-diyl)diphenol and 0.4159 g of t-butylammonium bromide were added to a 3000 ml three-neck round bottom flask and mixed, and 2359 g of epichlorohydrin was added thereto, and then reaction was performed by heating the mixture to 90° C. When liquid chromatography analysis confirmed that 4,4'-(9H-xanthene-9,9-diyl)diphenol was completely consumed, the mixture was cooled to 30° C. and a 50% NaOH aqueous solution (3 equivalents) was slowly added to the mixture. When liquid chromatography analysis confirmed that epichlorohydrin was completely consumed, extraction was performed using dichloromethane. After extraction, washing was performed three times, an organic layer was dried using magnesium sulfate, dichloromethane was distilled under reduced pressure, and recrystallization was performed using a 50:50 mixture of dichloromethane and methanol.

1 equivalent of the synthesized epoxy compound, 0.004 equivalents of t-butylammonium bromide, 0.001 equivalents of 2,6-diisobutylphenol, and 2.2 equivalents of acrylic acid were mixed, and 24.89 g of propylene glycol monomethyl ether acetate as a solvent was added thereto and mixed. The reaction solution was heated to 90 to 100° C. while blowing air at a rate of 25 ml/min to perform dissolution. The reaction solution in a cloudy state was heated to 120° C. to completely dissolve the reaction solution. When the solution Formula 25

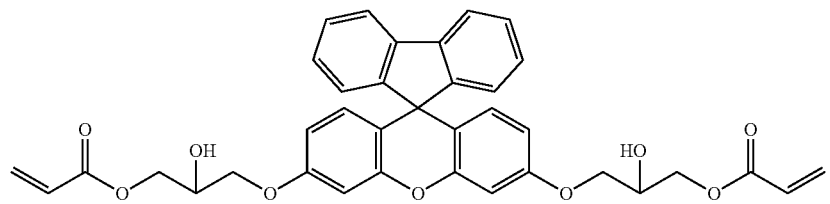

(2) 600 g of propylene glycol monomethyl ether acetate was added to 307.0 g of the compound represented by Formula 25 and dissolved, and 78 g of biphenyltetracarboxylic dianhydride and 1 g of brominated tetraethylammonium were added and mixed, and reaction was performed by heating the mixture to 110 to 115° C. for 4 hours. After confirming that acid anhydride groups were completely became clear and had a high viscosity, the acid value was measured and the solution was stirred until the acid value became less than 1.0 mg KOH/g. Stirring for 11 hours was required until the acid value reached a target value (0.8). After completion of the reaction, the temperature of the reactor was lowered to room temperature to obtain a colorless, transparent compound.

Formula 26

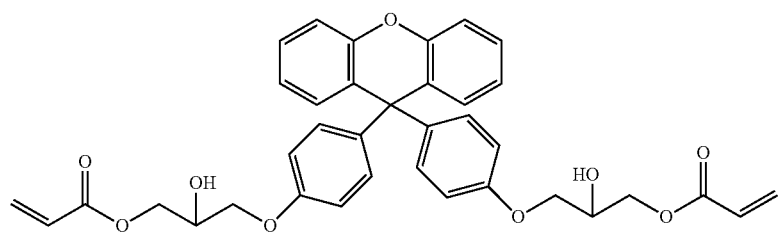

(2) 600 g of propylene glycol monomethyl ether acetate was added to 307.0 g of the compound represented by Formula 26 and mixed, and 78 g of biphenyltetracarboxylic dianhydride and 1 g of brominated tetraethylammonium were added and mixed, and the mixture was slowly heated and reaction was performed at 110 to 115° C. for 4 hours. After confirming that acid anhydride groups were completely consumed, 38.0 g of 1,2,3,6-tetrahydrophthalic anhydride was added and the mixture was reacted at 90° C. for 6 hours to polymerize a cardo-based binder resin. Consumption of the anhydride was confirmed by an IR spectrum.

Synthesis Example 5

Cardo-Based Binder Resin (E-7)—Example 5

(1) After a reflux condenser and a thermometer were installed in a three-neck flask, 42.5 g of 9,9-bisphenolfluorene was added to the flask and 220 mL of 2-(chloromethyl)oxirane was added thereto. Then, 100 mg of tetrabutylammonium bromide was added to the flask, and the mixture was heated to 90° C. while stirring the mixture. Vacuum distillation was performed after confirming that the unreacted content was less than 0.3%.

After lowering the temperature to 30° C., dichloromethane was injected, and NaOH was slowly added. High-performance liquid chromatography (HPLC) was used to confirm that the product was 96% or more, and the reaction was terminated by adding 5% HCl. The reaction product was extracted and layers were separated, and an organic layer was washed with water to be neutralized. The organic layer was dried with MgSO4 and vacuum distillation was performed using a rotary evaporator to concentrate the organic layer. Dichloromethane was added to the concentrated product, and the mixture was heated to 40° C. while stirring. After adding methanol, the temperature of the solution was lowered and stirred. The resulting solid was filtered, and vacuum dehydration was performed at room temperature to obtain 52.7 g of white solid powder (yield 94%). The structure of the powder was confirmed by 1H NMR.

REACTION FORMULA 1

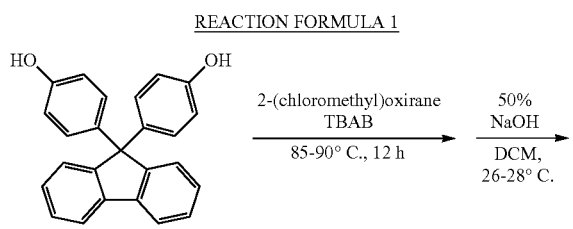

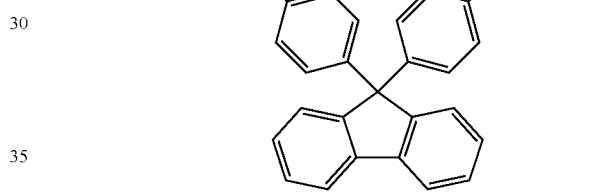

1H NMR in CDCl3: 7.75 (2H), 7.35-7.254 (6H), 7.08 (4H), 6.74 (4H), 4.13 (2H), 3.89 (2H), 3.30 (2H), 2.87 (2H), 2.71 (2H).

(2) Example of Formula 16, synthesis of 3,3'-(((9H-fluorene-9,9-diyl)bis(4,1-phenylene))bis(oxy))bis(1-(phenylthio)propan-2-ol After a reflux condenser and a thermometer was installed in a three-neck flask, the step 1 reaction product (1000 g), 524 g of thiophenol, and 617 g of ethanol were added to the flask and stirred. 328 g of triethylamine was slowly added dropwise into the reaction solution. High-performance liquid chromatography (HPLC) was used to confirm that the starting materials were consumed, and the reaction was terminated. After completion of the reaction, vacuum distillation was performed to remove ethanol. Organic materials were dissolved in dichloromethane, washed with water, and then dichloromethane was removed by performing vacuum distillation. The concentrated organic materials were dissolved in ethyl acetate, an ether solvent was added dropwise, and the mixture was stirred for 30 minutes. Vacuum distillation was performed on the compound to obtain 945 g of pale yellow oil (yield 64%), and the structure of the pale yellow oil was confirmed by 1H NMR.

REACTION FORMULA 2

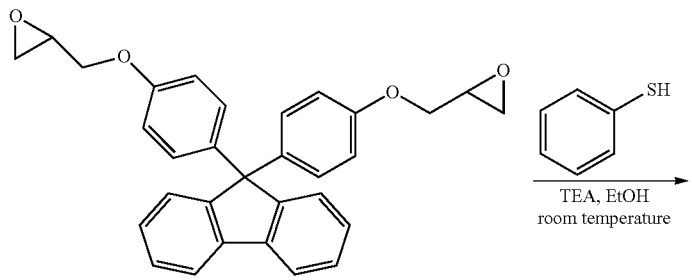

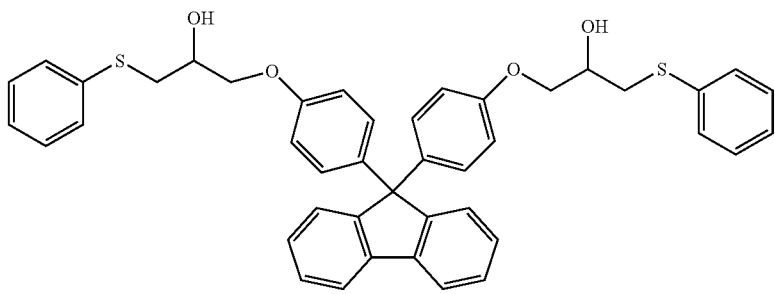

1H NMR in CDCl3: 7.82 (2H), 7.38-6.72 (20H), 6.51 (4H), 4.00 (2H), 3.97 (2H), 3.89 (2H), 3.20 (2H), 3.01 (2H), 2.64 (2H).

(3) Synthesis of Binder Resin

After a reflux condenser and a thermometer were installed in a three-neck flask, 200 g of 3,3'-(((9H-fluorene-9,9-diyl)bis(4,1-phenylene))bis(oxy))bis(1-phenylthio)propan-2-431) monomer synthesized in step 2, which was dissolved in a 50% PGMEA solvent, was added to the flask, and heated to 115° C. After adding 31.1 g of 3,3',4,4'-biphenyltetracarboxylic dianhydride at 115° C., the mixture was stirred for 6 hours while maintained at 115° C. After stirring, 7.35 g of phthalic anhydride was added and additional stirring was performed for 2 hours. After additional stirring, the reaction was terminated. After cooling, a binder resin having a weight-average molecular weight of 3,500 g/mol was obtained.

Synthesis Example 6

Cardo-Based Binder Resin (E-8)—Example 6

After a reflux condenser and a thermometer were installed in a three-neck flask, 200 g of 3,3'-(((9H-fluorene-9,9-diyl)bis(4,1-phenylene))bis(oxy))bis(1-(phenylthio)propan-2-431) monomer synthesized in Synthesis Example 5, which was dissolved in a 50% PGMEA solvent, was added to the flask, and heated to 115° C. After adding 21.1 g of pyromellitic dianhydride at 115° C., the mixture was stirred for 6 hours while maintained at 115° C. After stirring, 7.35 g of phthalic anhydride was added, and additional stirring was performed for 2 hours. After additional stirring, the reaction was terminated. After cooling, a binder resin having a weight-average molecular weight of 4,500 g/mol was obtained.

Synthesis Example 7

Cardo-Based Binder Resin (E-5)—Comparative Example 1

(1) 138 g of 9,9'-bis(4-glysiloxyphenyl)fluorene (HEAR CHEM. Co.) as a bisphenol epoxy compound, 54 g of acrylic acid, 1.4 g of benzyltriethylammonium chloride (DAEJUNG CHEM. Co.), 1 g of triphenylphosphine (ALDRICH Co.), 128 g of propylglycol methyl ethyl acetate (DAICEL CHEM. Co.), and 0.5 g of hydroquinone were added to a reactor, and heated to 120° C. and the temperature was maintained to synthesize a compound represented by Formula 27.

(2) 60 g of the compound represented by Formula 27, 11 g of biphenyltetracarboxylic dianhydride (MITSUBISHI GAS Co.), 3 g of tetrahydrophthal anhydride (ALDRICH Co.), 20 g of propyl glycol methyl ethyl acetate (DAICEL CHEM. Co.), and 0.1 g of N,N'-tetramethylammonium chloride were added to a reactor, and heated to 120° C. and the temperature was maintained for 2 hours to synthesize a compound represented by Formula 28. The weight-average molecular weight of the obtained compound represented by Formula 28 was 5,400 g/mol.

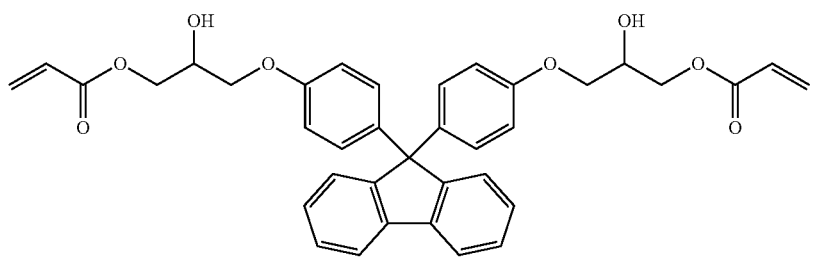

Formula 27

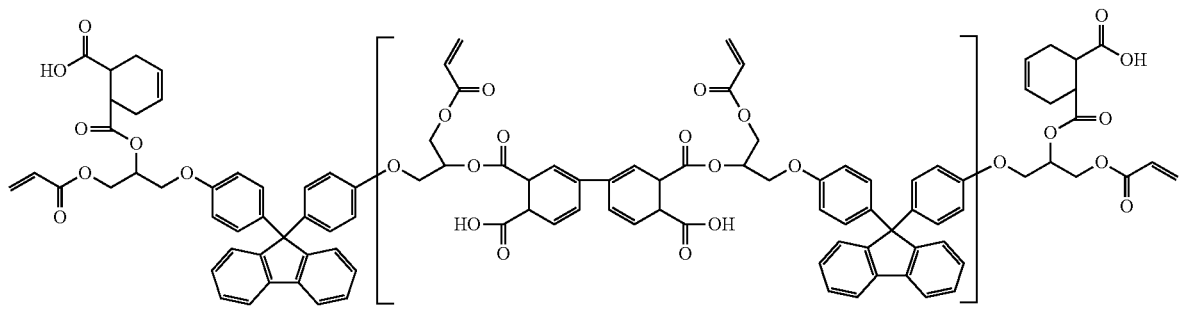

Formula 28

Synthesis Example 8

Alkali-Soluble Resin (E-6)—Comparative Example 2

A flask equipped with a stirrer, a thermometer, a reflux condenser, a dropping funnel, and a nitrogen inlet tube was prepared. 45 parts by weight of N-benzylmaleimide, 45 parts by weight of methacrylic acid, 10 parts by weight of tricyclodecyl methacrylate, 4 parts by weight of t-butylperoxy-2-ethylhexanoate, and 40 parts by weight of propylene glycol monomethyl ether acetate (hereinafter, PGMEA) were added to the flask and mixed, and a dropping lot for a monomer was prepared. 6 parts by weight of n-dodecanethiol and 24 parts by weight of PGMEA were added and mixed, and a dropping lot for a chain-transfer agent was prepared. Then, 395 parts by weight of PGMEA was introduced into the flask, the atmosphere in the flask was changed from air to nitrogen, and the temperature of the flask was raised to 90° C. with stirring. Then, monomers and a chain-transfer agent were added dropwise from the dropping funnel. Each dropping process was performed for 2 hours under the condition that a temperature was maintained at 90° C. After 1 hour, the temperature was raised to 110° C. and maintained for 3 hours. Then, a gas inlet tube was introduced to initiate bubbling of a mixed gas (oxygen/nitrogen: 5/95 (v/v)). Next, 10 parts by weight of glycidyl methacrylate, 0.4 parts by weight of 2,2'-methylenebis(4-methyl-6-t-butylphenol), and 0.8 parts by weight of triethylamine were added to the flask, and reaction was performed at 110° C. for 8 hours. Then, the reaction was cooled to room temperature to obtain an alkali-soluble resin having a solid content of 29.1% by weight, a weight-average molecular weight of 32,000, and an acid value of 114 mgKOH/g.

Preparation of Self-Emissive Photosensitive Resin Composition

Examples 1 to 14 and Comparative Examples 1 to 4

Self-emissive photosensitive resin compositions according to the examples and comparative examples were prepared using components and contents shown in Tables 1 and 2.

TABLE 1

| Composition (% by weight) | | Examples | | | | | | | | | | | | | |
|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 |
| Quantum dot dispersion | A-1[1] | 50 | 50 | — | — | 50 | 50 | 50 | 50 | — | — | — | — | — | — |
| | A-2[2] | — | — | 50 | 50 | — | — | — | — | 50 | 50 | 50 | 50 | 50 | 50 |
| Alkali-soluble resin | E-1[3] | 9.5 | — | 9.5 | — | — | — | 6.5 | — | — | — | — | — | — | — |
| | E-2[4] | — | 9.5 | — | 9.5 | — | — | — | 6.5 | — | — | 2 | 2 | — | — |
| | E-3[5] | — | — | — | — | 9.5 | — | — | — | — | 3 | — | — | 3 | — |
| | E-4[6] | — | — | — | — | — | 9.5 | — | — | 3 | — | — | — | — | 6.5 |
| | E-7[7] | — | — | — | — | — | — | — | — | 6.5 | — | 4.5 | — | 6.5 | 3 |
| | E-8[8] | — | — | — | — | — | — | — | — | — | 6.5 | — | 4.5 | — | — |
| | E-5[9] | — | — | — | — | — | — | — | — | — | — | — | — | — | — |
| | E-6[10] | — | — | — | — | — | — | — | 3 | 3 | — | — | 3 | 3 | — |
| Photopolymerizable compound[11] | | 1.98 | 1.98 | 1.98 | 1.98 | 1.98 | 1.98 | 1.98 | 1.98 | 1.98 | 1.98 | 1.98 | 1.98 | 1.98 | 1.98 |

TABLE 1-continued

| Composition (% by weight) | | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| Photopoly- merization initiator | C-1[12] | 0.21 | 0.21 | 0.21 | 0.21 | 0.21 | 0.21 | 0.21 | 0.21 | 0.21 | 0.21 | 0.21 | 0.21 | 0.21 | 0.21 |
| | C-2[13] | 0.1 | 0.1 | 0.1 | 0.1 | 0.1 | 0.1 | 0.1 | 0.1 | 0.1 | 0.1 | 0.1 | 0.1 | 0.1 | 0.1 |
| | C-3[14] | 0.4 | 0.4 | 0.4 | 0.4 | 0.4 | 0.4 | 0.4 | 0.4 | 0.4 | 0.4 | 0.4 | 0.4 | 0.4 | 0.4 |
| | C-4[15] | 0.4 | 0.4 | 0.4 | 0.4 | 0.4 | 0.4 | 0.4 | 0.4 | 0.4 | 0.4 | 0.4 | 0.4 | 0.4 | 0.4 |
| Solvent[16] | | 37.41 | 37.41 | 37.41 | 37.41 | 37.41 | 37.41 | 37.41 | 37.41 | 37.41 | 37.41 | 37.41 | 37.41 | 37.41 | 37.41 |

[1] Quantum dot dispersion prepared according to Preparation Example 3
[2] Quantum dot dispersion prepared according to Preparation Example 4
[3] Cardo-based binder resin prepared according to Synthesis Example 1
[4] Cardo-based binder resin prepared according to Synthesis Example 2
[5] Cardo-based binder resin prepared according to Synthesis Example 3
[6] Cardo-based binder resin prepared according to Synthesis Example 4
[7] Cardo-based binder resin prepared according to Synthesis Example 5
[8] Acrylic binder resin prepared according to Synthesis Example 6
[9] Cardo-based binder resin prepared according to Synthesis Example 7
[10] Acrylic binder resin prepared according to Synthesis Example 8
[11] Dipentaerythritol hexaacrylate (KAYARAD DPHA; NIPPON KAYAKU Co.)
[12] 2-benzyl-2-dimethylamino-1-(4-morpholinophenyl)butan-1-one (Irgacure 369; CIBA SPECIALTY CHEM. Co.)
[13] 4,4'-di(N,N'-dimethylamino)-benzophenone (HODOGAYA KAGAKU Co.)
[14] Irgacure OXE01 (CIBA SPECIALTY CHEM. Co.)
[15] Irgacure OXE03 (CIBA SPECIALTY CHEM. Co.)
[16] Propylene glycol monomethyl ether acetate

TABLE 2

| Composition (% by weight) | | Comparative Examples | | | |
|---|---|---|---|---|---|
| | | 1 | 2 | 3 | 4 |
| Quantum dot dispersion | A-1[1] | 50 | 50 | — | — |
| | A-2[2] | — | — | 50 | 50 |
| Alkali-soluble resin | E-1[3] | — | — | — | — |
| | E-2[4] | — | — | — | — |
| | E-3[5] | — | — | — | — |
| | E-4[6] | — | — | — | — |
| | E-7[7] | 9.5 | — | 9.5 | — |
| | E-8[8] | 9.5 | — | 9.5 | — |
| | E-5[9] | 9.5 | — | 9.5 | — |
| | E-6[10] | — | 9.5 | — | 9.5 |
| Photopolymerizable compound[11] | | 1.98 | 1.98 | 1.98 | 1.98 |
| Photopolymerization initiator | C-1[12] | 0.21 | 0.21 | 0.21 | 0.21 |
| | C-2[13] | 0.1 | 0.1 | 0.1 | 0.1 |
| | C-3[14] | 0.4 | 0.4 | 0.4 | 0.4 |
| | C-4[15] | 0.4 | 0.4 | 0.4 | 0.4 |
| Solvent[16] | | 37.41 | 37.41 | 37.41 | 37.41 |

[1] Quantum dot dispersion prepared according to Preparation Example 3
[2] Quantum dot dispersion prepared according to Preparation Example 4
[3] Cardo-based binder resin prepared according to Synthesis Example 1
[4] Cardo-based binder resin prepared according to Synthesis Example 2
[5] Cardo-based binder resin prepared according to Synthesis Example 3
[6] Cardo-based binder resin prepared according to Synthesis Example 4
[7] Cardo-based binder resin prepared according to Synthesis Example 5
[8] Acrylic binder resin prepared according to Synthesis Example 6
[9] Cardo-based binder resin prepared according to Synthesis Example 7
[10] Acrylic binder resin prepared according to Synthesis Example 8
[11] Dipentaerythritol hexaacrylate (KAYARAD DPHA; NIPPON KAYAKU Co.)
[12] 2-benzyl-2-dimethylamino-1-(4-morpholinophenyl)butan-1-one (Irgacure 369; CIBA SPECIALTY CHEM. Co.)
[13] 4,4'-di(N,N'-dimethylamino)-benzophenone(HODOGAYA KAGAKU Co.)
[14] Irgacure OXE01 (CIBA SPECIALTY CHEM. Co.)
[15] Irgacure OXE03 (CIBA SPECIALTY CHEM. Co.)
[16] Propylene glycol monomethyl ether acetate Preparation of Color Filter Color filters were prepared using self-emissive photosensitive resin compositions prepared according to the examples and comparative examples. That is, each of the self-emissive photosensitive resin compositions was applied on a glass substrate by spin coating, then placed on a heating plate, and maintained at a temperature of 100° C. for 2 minutes to form a thin film.

Subsequently, a test photomask having a pattern for changing transmittance in a range of 1 to 100% in a stepwise manner and a line/space pattern of 1 to 50 µm was placed on the thin film, and the distance between the thin film and the test photomask was set to 50 µm, and the thin film was irradiated with ultraviolet light.

At this time, a 1 kW high-pressure mercury lamp containing g, h and i lines was used as an ultraviolet light source, and an illuminance of 100 mJ/cm$^2$ was used for irradiation. No special optical filters were used.

The ultraviolet rays-irradiated thin film was immersed in a KOH aqueous solution having a pH 10.5 for 2 minutes to develop. A glass plate coated with the thin film was washed with distilled water, dried by blowing nitrogen gas, and heated for 20 minutes in an oven set at 230° C. to prepare a color filter pattern. The thickness of the self-emissive color pattern prepared above was 3.0 µm.

Experimental Example (1) Surface Hardness

The curing degree of the films prepared according to the examples and the comparative examples was measured using a hardness tester (HM500; FISCHER Co.). Results obtained are shown in Table 3 below. Surface hardness was evaluated by the following criteria.

1. <Evaluation standard>
2. ○: surface hardness of 30 or more
3. Δ: surface hardness of not less than 10 to less than 30
4. x: surface hardness of not less than 10

(2) Solvent Resistance

The solvent resistance of films prepared according to the examples and comparative examples with respect to a n-methyl-2-pyrrolidone (NMP) solvent was evaluated. Membranes were cut to a size of 3×3 cm and placed in 5 g of NMP. The membranes were left for 30 minutes in an oven set at 100° C. Then, the NMP solvent was recovered, and the absorbance of the coloring materials extracted in the NMP solvent was measured using a UV-vis spectrometer (UV-2550, SHIMATZU Co.). Results obtained are shown in Table 3. Solvent resistance was evaluated using the following criteria.

In general, when the absorbance is usually 3 or more, solvent resistance is poor, and such a film is not suitable for preparation of a color filter.

1. <Evaluation standard>
2. ○: absorbance of less than 1
3. Δ: absorbance of not less than 1 to less than 3
4. x: absorbance of not less than 3

(3) Luminescence Intensity

In the color filter in which the self-emissive color filter pattern was formed, the luminous efficiency of a photo-converted region was measured by a spectrum meter (OCEAN OPTICS Co.) through a 365 nm tube type 4W UV illuminator (VL-4LC, VILBER LOURMAT) in a pattern portion formed in a pattern of a 20 mm×20 mm square. A high luminous efficiency indicates that luminescence efficiency is excellent. Measurement results are shown in Table 3.

In addition, hard bake was conducted at 230° C. for 60 minutes, and luminescence efficiency before the hard bake and luminescence efficiency after the hard bake were measured. The level at which luminescence efficiency was maintained was confirmed and is shown in Table 3 as a light retention ratio.

(4) Evaluation of Developability

Color filters were prepared using the self-emissive photosensitive resin compositions prepared according to the examples and comparative examples. That is, each of the self-emissive photosensitive resin compositions was applied on a glass substrate by spin coating, then placed on a heating plate, and maintained at a temperature of 100° C. for 5 minutes to form a thin film.

Developability was then evaluated by immersion evaluation in a 0.04% KOH solution for 2 minutes. Results are shown in Table 3.

1. ○: dissolution
2. Δ: dissolution after flaking
3. x: flaking

Referring to Table 3, films prepared according to Examples 1 to 14, in which the self-emissive photosensitive resin composition according to the present invention was used, had excellent hardness and solvent resistance and exhibited high luminescence efficiency (%) and a high light retention rate (%), compared to films prepared according to Comparative Examples 1 to 4, in which the cardo-based binder resin according to the present invention was not used. In particular, in Examples 7 to 8, when a cardo-based binder resin and an acrylic binder resin were used at the same time, light retention was excellent. In addition, in Examples 9 to 14, the introduction of a novel cardo-based binder resin was highly effective for the formation of an excellent pattern due to developability of a dissolution type.

What is claimed is:

1. A self-emissive photosensitive resin composition, comprising an alkali-soluble resin including a cardo-based binder resin that comprises at least one of repeating units represented by Formulas 3 and 4 below, wherein the alkali-soluble resin further comprises a cardo-based binder resin comprising at least one of repeating units represented by Formulas 5 and 6 below, the cardo-based binder resin comprising at least one of repeating units represented by Formulas 5 and 6 is contained in an amount of 20 to 80 parts by weight, with respect to 100 parts by weight of the total alkali-soluble resin

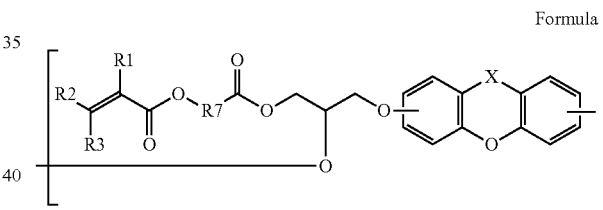

Formula 3

TABLE 3

| | Surface hardness | Solvent resistance | Luminescence efficiency (%) | Light retention rate (%) | Developability |
|---|---|---|---|---|---|
| Example 1 | ○ | ○ | 28% | 75% | ○ |
| Example 2 | ○ | ○ | 29% | 78% | ○ |
| Example 3 | ○ | ○ | 29% | 78% | ○ |
| Example 4 | ○ | ○ | 30% | 76% | ○ |
| Example 5 | ○ | ○ | 30% | 81% | ○ |
| Example 6 | ○ | ○ | 31% | 80% | ○ |
| Example 7 | ○ | ○ | 28% | 84% | ○ |
| Example 8 | ○ | ○ | 28% | 83% | ○ |
| Example 9 | ○ | ○ | 32% | 85% | ○ |
| Example 10 | ○ | ○ | 31% | 87% | ○ |
| Example 11 | ○ | ○ | 29% | 91% | ○ |
| Example 12 | ○ | ○ | 28% | 89% | ○ |
| Example 13 | ○ | ○ | 30% | 90% | ○ |
| Example 14 | ○ | ○ | 32% | 91% | ○ |
| Comparative Example 1 | Δ | Δ | 24% | 50% | x |
| Comparative Example 2 | x | x | 18% | 70% | Δ |
| Comparative Example 3 | Δ | Δ | 23% | 55% | x |
| Comparative Example 4 | x | Δ | 19% | 73% | Δ |

-continued

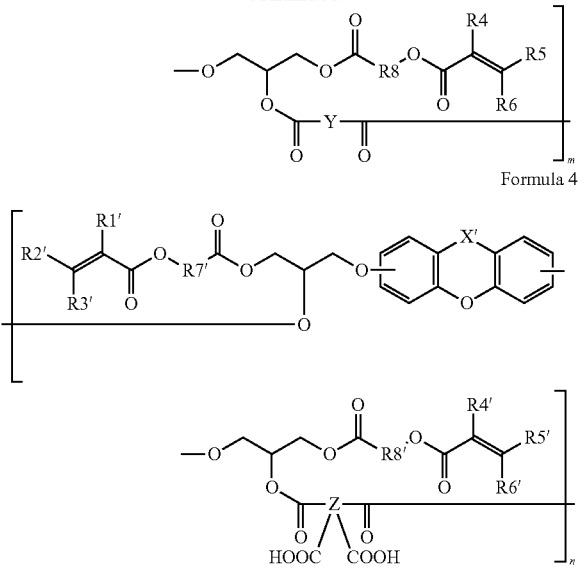

Formula 4 wherein in Formulas 3 and 4,

X and X' each independently represent a single bond, —CO—, —SO$_2$—, —C(CF$_3$)$_2$—, —Si(CH$_3$)$_2$—, —CH$_2$—, —C(CH$_3$)$_2$—, —O—,

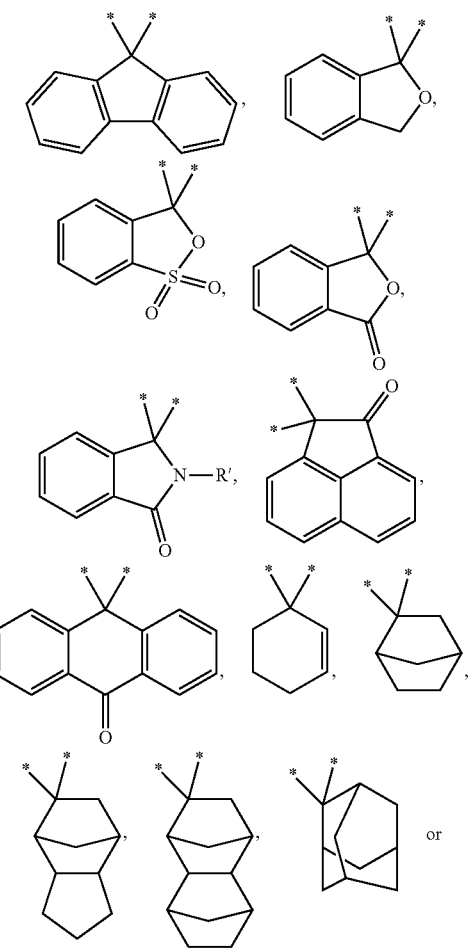

-continued

Y represents an acid anhydride residue;
Z represents an acid dianhydride residue;
R' represents a hydrogen atom, an ethyl group, a phenyl group, —C$_2$H$_4$Cl, —C$_2$H$_4$OH or —CH$_2$CH=CH;
R1, R1', R2, R2', R3, R3', R4, R4', R5, R5', R6 and R6' each independently represent a hydrogen atom or a methyl group;
R7, R7', R8 and R8' each independently represent a straight- or branched-chain alkylene group having 1 to 6 carbon atoms, wherein the alkylene group is interrupted by at least one of an ester bond, a cycloalkylene group having 6 to 14 carbon atoms, and an arylene group having 6 to 14 carbon atoms; and
m and n are integers satisfying 0≤m≤30 and 0≤n≤30, respectively,
provided that m and n are not 0 at the same time, Formula 5

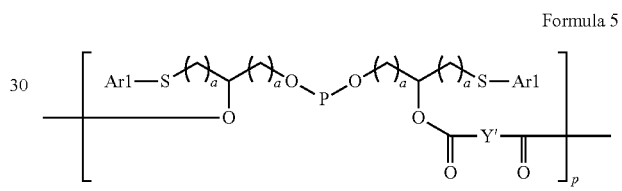

Formula 6

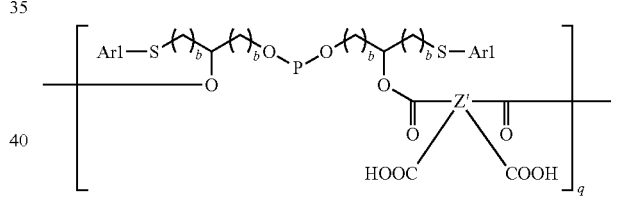

wherein in Formulas 5 and 6,
P each independently represents

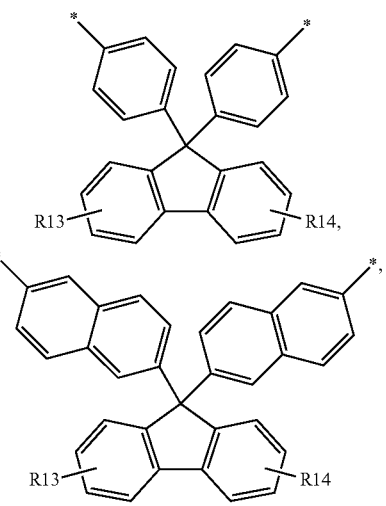

-continued

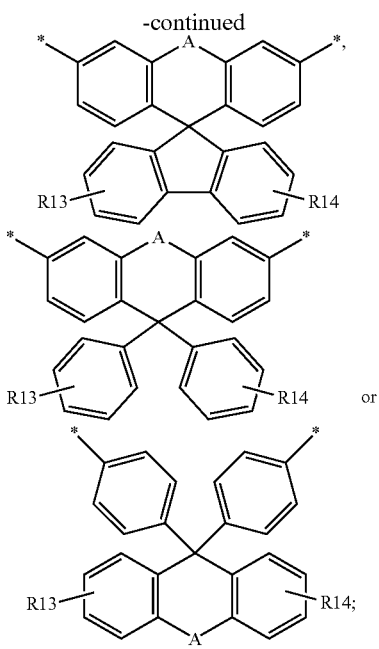

R13 and R14 each independently represent hydrogen, a hydroxyl group, a thiol group, an amino group, a nitro group or a halogen atom;

Ar1 each independently represents a C6 to C15 aryl group;

Y' represents an acid anhydride residue;

Z' represents an acid dianhydride residue;

A represents O, S, N, Si or Se;

a and b are each independently an integer of 1 to 6; and p and q are each independently an integer of 0 to 30, provided that p and q are not 0 at the same time.

2. The self-emissive photosensitive resin composition according to claim 1, further comprising one or more species selected from the group consisting of quantum dots, scattering particles, photopolymerizable compounds, photopolymerization initiators and solvents.

3. The self-emissive photosensitive resin composition according to claim 1, wherein the cardo-based binder resin is contained in an amount of 1 to 50 parts by weight with respect to 100 parts by weight of the total self-emissive photosensitive resin composition.

4. The self-emissive photosensitive resin composition according to claim 2, wherein the scattering particles comprise one or more metal oxides selected from the group consisting of Li, Be, B, Na, Mg, Al, Si, K, Ca, Sc, V, Cr, Mn, Fe, Ni, Cu, Zn, Ga, Ge, Rb, Sr, Y, Mo, Cs, Ba, La, Hf, W, Tl, Pb, Ce, Pr, Nd, Pm, Sm, Eu, Gd, Tb, Dy, Ho, Er, Tm, Yb, Ti, Sb, Sn, Zr, Nb, Ce, Ta, In, and combinations thereof.

5. The self-emissive photosensitive resin composition according to claim 4, wherein the metal oxides include one or more selected from the group consisting of $Al_2O_3$, $SiO_2$, ZnO, $ZrO_2$, $BaTiO_3$, $TiO_2$, $Ta_2O_5$, $Ti_3O_5$, ITO, IZO, ATO, ZnO-Al, $Nb_2O_3$, SnO, MgO, and combinations thereof.

6. The self-emissive photosensitive resin composition according to claim 1, wherein the alkali-soluble resin further comprises an acrylic binder resin.

7. A color filter, comprising a cured product of the self-emissive photosensitive resin composition according to claim 1.

8. An image display device, comprising the color filter according to claim 7.

* * * * *